(12) United States Patent
Andry et al.

(10) Patent No.: US 7,449,067 B2
(45) Date of Patent: Nov. 11, 2008

(54) METHOD AND APPARATUS FOR FILLING VIAS

(75) Inventors: Paul S. Andry, Mohegan Lake, NY (US); Jon A. Casey, Poughkeepsie, NY (US); Raymond R. Horton, Dover Plains, NY (US); Chiraq S. Patel, Peekskill, NY (US); Edmund J. Sprogis, Underhill, VT (US); Brian R. Sundlof, Verbank, NY (US)

(73) Assignee: International Business Machines Corporation, Armonk, NY (US)

( * ) Notice: Subject to any disclaimer, the term of this patent is extended or adjusted under 35 U.S.C. 154(b) by 608 days.

(21) Appl. No.: 10/700,327

(22) Filed: Nov. 3, 2003

(65) Prior Publication Data

US 2005/0106834 A1    May 19, 2005

(51) Int. Cl.
 *B05C 1/00* (2006.01)
 *B05C 3/00* (2006.01)
 *B05C 3/18* (2006.01)
(52) U.S. Cl. .................. 118/209; 141/270; 141/284; 118/256
(58) Field of Classification Search .............. 141/267, 141/268, 270, 280, 283; 118/209, 211, 253, 118/256
See application file for complete search history.

(56) References Cited

U.S. PATENT DOCUMENTS

| | | | | |
|---|---|---|---|---|
| 4,954,313 A * | 9/1990 | Lynch | ........................... | 419/9 |
| 5,242,641 A * | 9/1993 | Horner et al. | ................ | 264/104 |
| 5,244,143 A | 9/1993 | Ference et al. | | |
| 5,720,324 A * | 2/1998 | Vinciarelli | ...................... | 141/1 |
| 5,775,569 A | 7/1998 | Berger et al. | | |
| 5,998,292 A | 12/1999 | Black et al. | | |
| 6,083,839 A * | 7/2000 | Wong | ......................... | 438/693 |
| 6,243,251 B1 * | 6/2001 | Kanno et al. | ................ | 361/234 |
| 6,454,154 B1 * | 9/2002 | Pedigo | ......................... | 228/33 |
| 6,506,332 B2 | 1/2003 | Pedigo | | |
| 6,534,865 B1 * | 3/2003 | Lopatin et al. | .............. | 257/751 |
| 6,593,644 B2 | 7/2003 | Chiu et al. | | |
| 6,695,020 B2 * | 2/2004 | Sakaida et al. | .............. | 141/234 |
| 6,767,170 B2 * | 7/2004 | Kostler et al. | ............... | 414/217 |
| 6,814,918 B2 * | 11/2004 | Pedigo | ....................... | 264/443 |
| 6,938,653 B2 * | 9/2005 | Sakaida et al. | .............. | 141/125 |

(Continued)

FOREIGN PATENT DOCUMENTS

JP         4-346292       * 12/1992

(Continued)

OTHER PUBLICATIONS

Filling the via hole of IC by VPES (Vacuum Printing Encapsulation Systems for stacked chip (3D Packaging), A. Okuno et al., 2002 Electronics Components and Technology Conference.

*Primary Examiner*—M. Wilczewski
(74) *Attorney, Agent, or Firm*—Robert M. Trepp; David Aker

(57) ABSTRACT

A method for filling vias, and in particular initially blind vias, in a wafer, and various apparatus for performing the method, comprising evacuating air from the vias; trapping at least a portion of the wafer and a paste for filling the vias between two surfaces; and pressurizing the paste to fill the vias.

19 Claims, 24 Drawing Sheets

U.S. PATENT DOCUMENTS

| | | | |
|---|---|---|---|
| 6,976,902 B2 * | 12/2005 | Koo et al. | 451/7 |
| 7,066,378 B2 * | 6/2006 | Pedigo | 228/248.1 |
| 7,068,489 B2 * | 6/2006 | Migita | 361/234 |
| 7,083,501 B1 * | 8/2006 | Fruitman | 451/41 |
| 7,094,695 B2 * | 8/2006 | Taylor | 438/691 |
| 2001/0014571 A1 * | 8/2001 | Robinson | 451/41 |
| 2002/0084556 A1 * | 7/2002 | Pedigo | 264/443 |
| 2003/0002973 A1 * | 1/2003 | Kostler et al. | 414/754 |
| 2003/0127777 A1 * | 7/2003 | Pedigo | 264/443 |
| 2005/0215178 A1 * | 9/2005 | Dornfeld et al. | 451/5 |

FOREIGN PATENT DOCUMENTS

| | | |
|---|---|---|
| JP | 05-055184 | 3/1993 |
| JP | 10-335784 | 12/1998 |
| JP | 11-268236 | 10/1999 |
| JP | 11-298138 | 10/1999 |
| JP | 2003-023246 | 1/2003 |
| JP | 2003-133723 | 5/2003 |
| JP | 2003-188534 | 7/2003 |
| JP | 2003-229659 | 8/2003 |
| JP | 2003-276159 | 9/2003 |

* cited by examiner

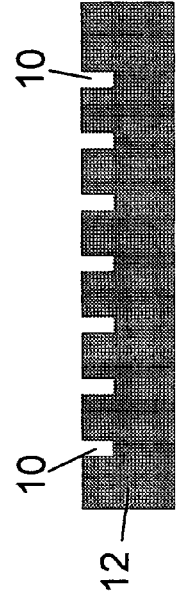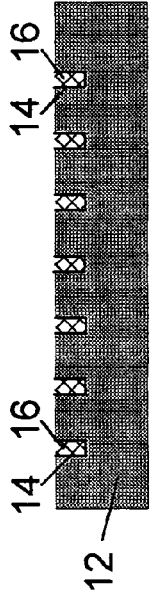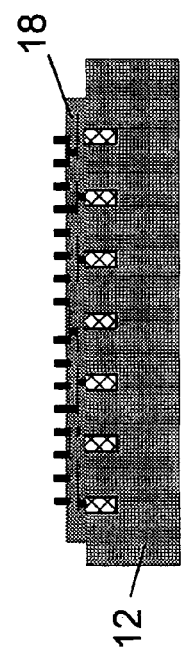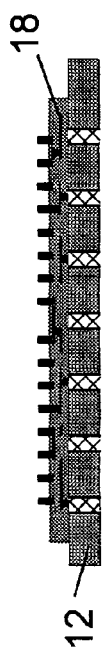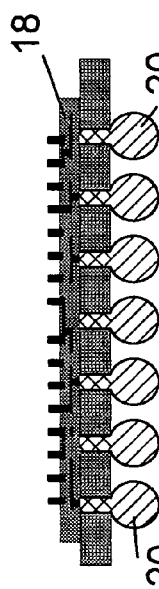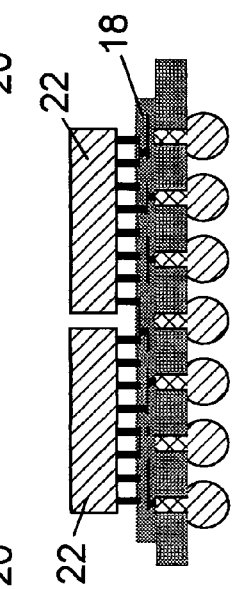
PRIOR ART
Fig. 1A
Fig. 1B
Fig. 1C
Fig. 1D
Fig. 1E
Fig. 1F

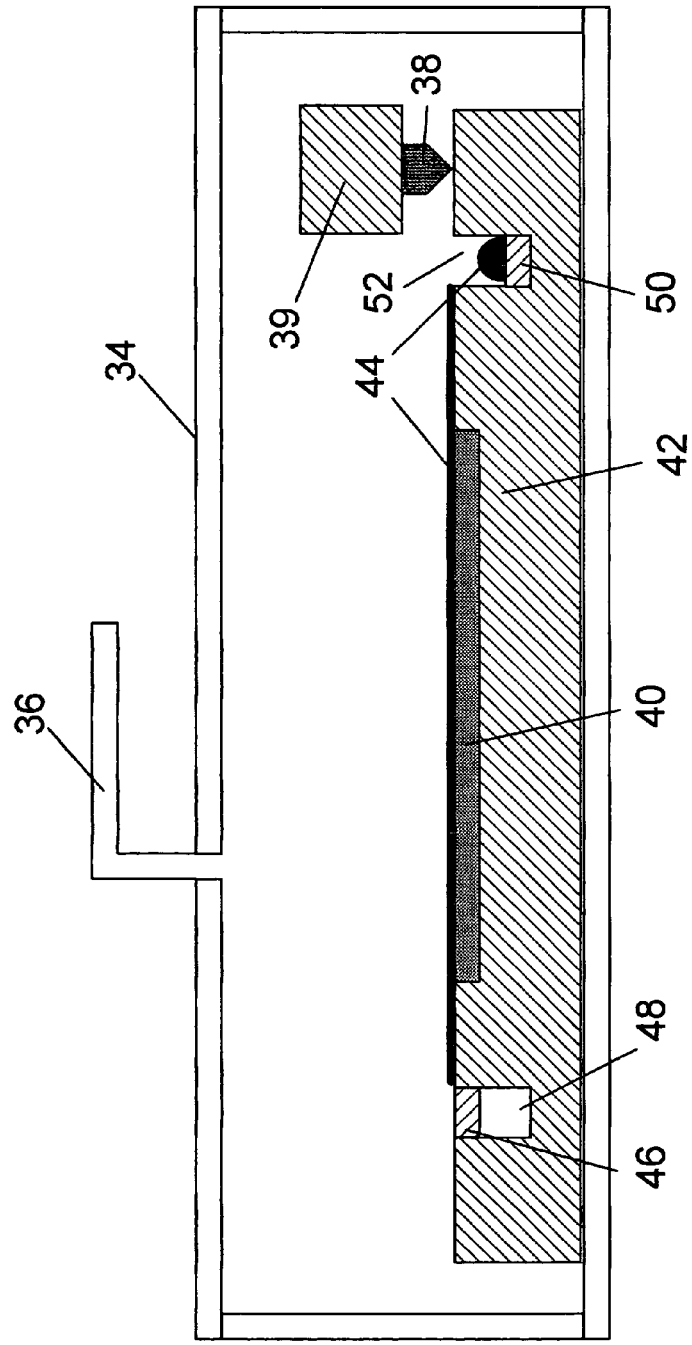

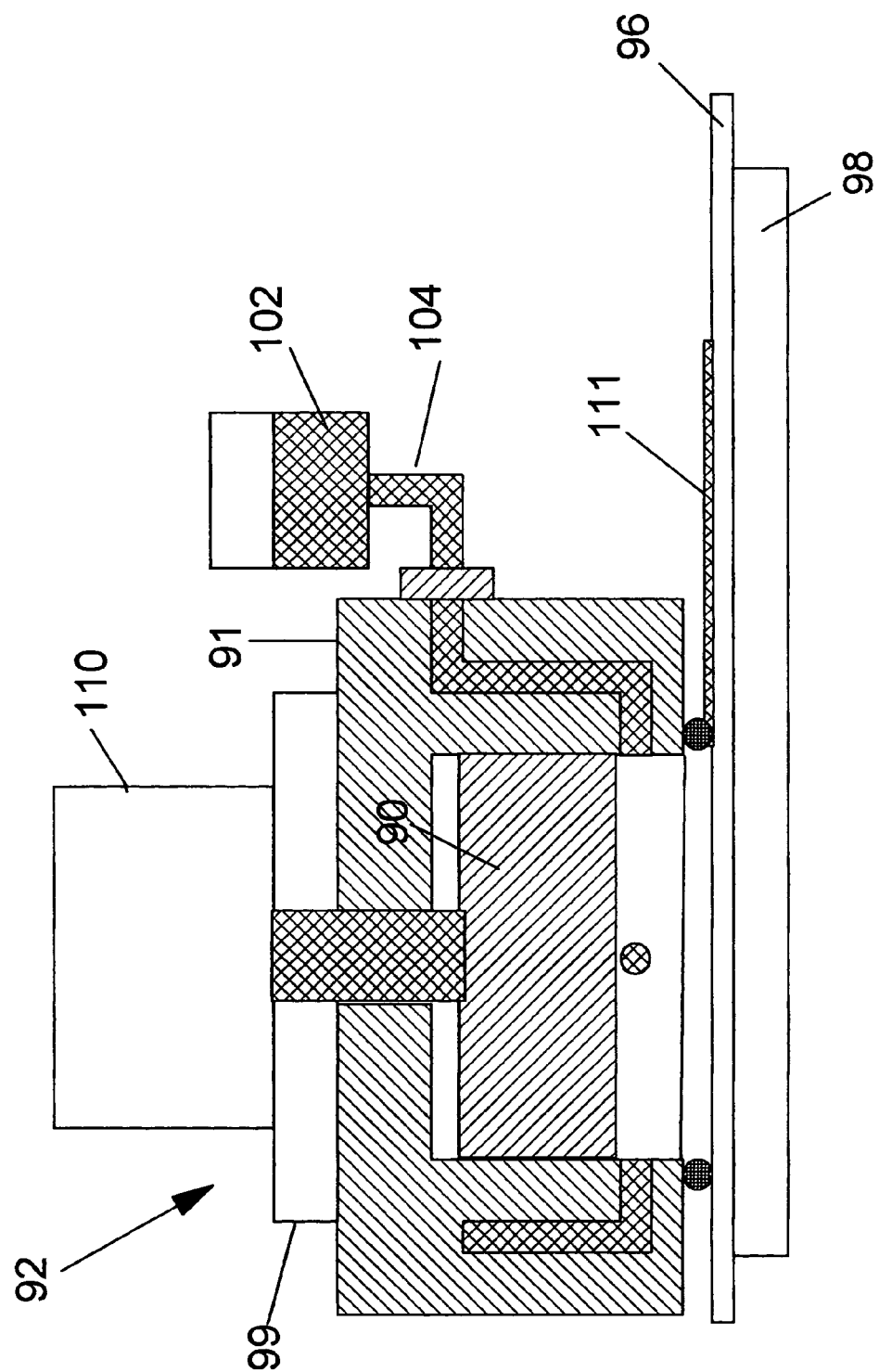

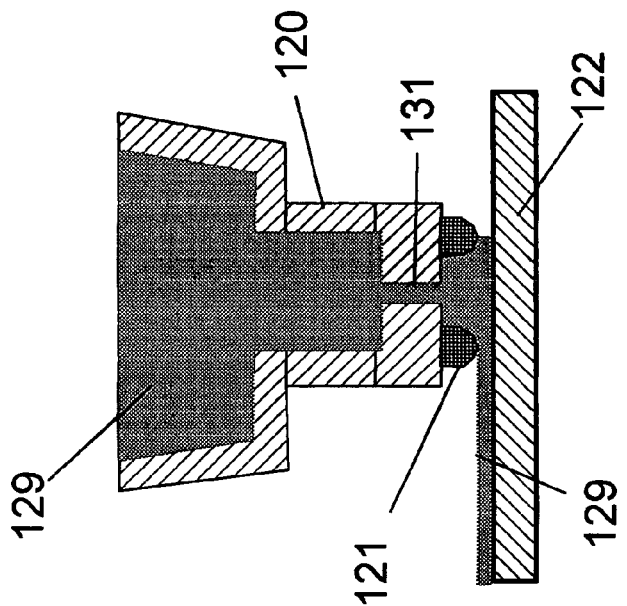
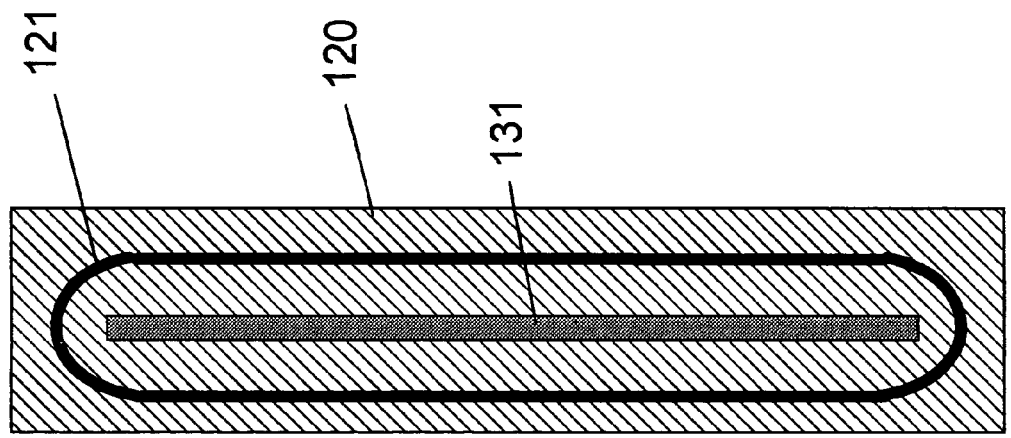
Fig. 6B
Fig. 6A

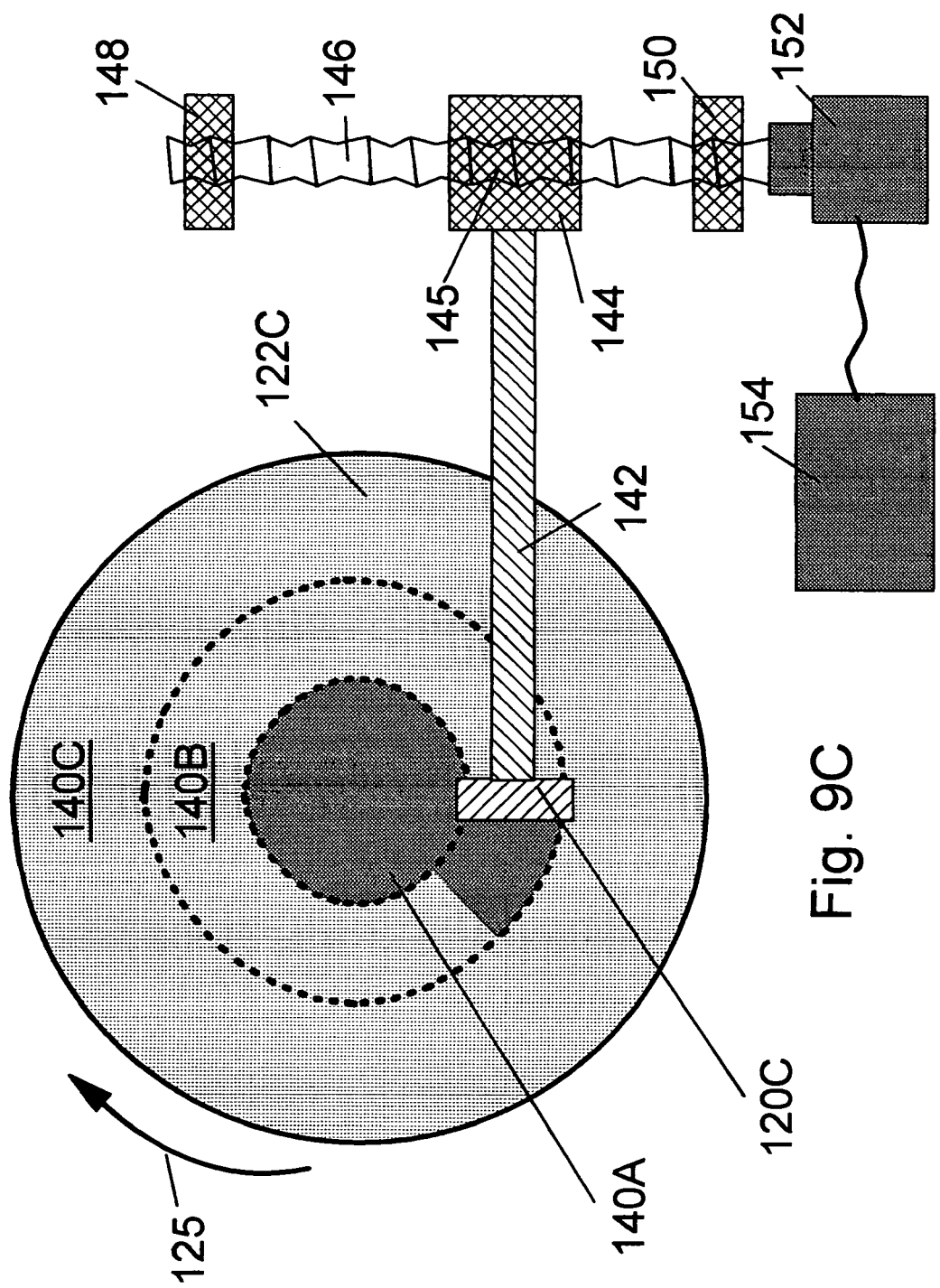

METHOD AND APPARATUS FOR FILLING VIAS

FIELD OF THE INVENTION

This invention is directed to a process and apparatus, and in particular tooling, for enabling the creation of filled, and preferably conductive, vias and through-vias in a semiconductor substrate. More particularly, it is directed to a process and apparatus for enabling the filling of such vias.

BACKGROUND OF THE INVENTION

There are many advantages to using silicon as a substrate for electronic packaging, rather than traditional ceramic and organic laminate packaging. Some of the key features of the silicon carrier include: the ability to create high performance wiring and joining at much finer pitch than typical packaging, the ability to join heterogeneous technologies or different generation technologies for high speed applications, the ability to integrate passives, MEMS or optical fibers, the ability to add silicon functionality to the carrier package in addition to wiring, the ability to dramatically increase the I/O density, and for many applications, the ability to reduce overall system cost when compared to other system on package (SOP) approaches which do not use Si as the carrier.

Elements and structures of semiconductor packages have been described in U.S. Pat. No. 5,998,292 to Black et al. and U.S. Pat. No. 6,593,644 to Chiu et al. In order to attain the advantages outlined above several key steps are necessary, as shown in FIGS. 1A to 1F. As illustrated in FIG. 1A, first, deep blind vias 10 (several hundred microns in depth) are etched into a silicon wafer 12, and sidewall insulation 14 is deposited. As shown in FIG. 1B, vias 10 must be completely filled with a conductor 16. Once the vias are filled, as shown in FIG. 1C, standard BEOL wiring levels 18 can be built on top of the silicon wafer 12, and the whole wafer can be thinned by backside grinding to expose the via conductors on the backside, as shown in FIG. 1D. As shown in FIG. 1E, solder connections, such as C4 solder balls 20 may then be built on the carrier back, and chips 22 may be joined to the front, by any one of a number of conventional techniques such as flip chip bonding as illustrated in FIG. 1F, completing the high performance silicon carrier package 24.

At this point there are several options, one of which is illustrated in FIG. 2, where the high performance silicon carrier package 24 is joined to a ceramic module 26 by means of solder balls 20, and then to a PC board 28 by means of, for example, additional C4 solder balls 30.

Of all the key technology elements described above, that which is most problematic is the filling of high aspect ratio blind vias with conductor. Filling with common metals by PVD or CVD methods is impractical, while plating becomes extremely difficult due to the tendency for the plated side walls to "breadloaf" at the top, cutting off the via from further filling, and trapping plating solution in a central void. Even if these or other methods of solid metal filling, such as filling with molten metal, could be made to work, typical metals have a large coefficient of thermal expansion (CTE) mismatch with silicon. There are three potential problems associated with large CTE mismatches between the vias and the silicon substrate: delamination at the via side walls; cracking of the silicon substrate between vias; and piston-like rupture of any overlying or underlying structures or thin films in contact with the top/bottom surfaces of the vias. Accordingly it is advantageous to use a material which is simultaneously conductive with a good CTE match to silicon.

One such material which has been used by International Business Machines Corporation in the production of glass ceramic multi-chip modules (MCM) is a paste containing a mixture of copper and glass particles suspended in a mixture of organic solvents and binders. Such pastes are typically applied to a patterned ceramic greensheet by a screen printing method, after which the sheets are stacked and sintered at high temperature, during which the organic components are burned off, and the glass and Cu components coalesce to form conductive lines and vias.

Recently, in "Filling the Via Hole of IC by VPES (Vacuum Printing Encapsulation Systems) for stacked chip (3D packaging)", Atsushi Okuno and Noriko Fujita, 2002 Electronic Components and Technology Conference have described the adaptation of a vacuum printing encapsulation system (VPES) for filling blind vias with conductive paste. The VPES method was originally used to deliver plastic resin in the manufacture of ball grid array (BGA) and CSP packaging, wafer level CSP packaging, transparent resin encapsulating for light emitting diode (LED) displays, flip-chip under-filling, and other processes. For BGA or CSP packaging, following die bonding and wire bonding on a printed circuit board substrate, the printing of liquid resin takes place using a squeegee applied to the substrate under vacuum. The substrate is then cured at a high temperature to solidify the liquid resin. After curing, solder balls for terminals are mounted on the backside of the substrate. Conventional screen printing lacked a process for removing the gas from the resin after the printed after curing, causing cracking or warping during the high temperature process.

In the method described by Okuno, a squeegee tool applies conductive paste using a knife edge. In this tool design, a vacuum is pulled inside the enclosure, and paste is delivered, for illustrative example, by a slot in the base of the tool.

An example of via filling using such a tool is shown in FIGS. 3A through FIG. 3F. In these figures, a vacuum chamber 34 is evacuated by means of a vacuum pump (not shown) connected to chamber 34 by a vacuum hose 36. Once sufficient vacuum is created, a squeegee blade 38, mounted an a moving member 39, moves across the surface of a via containing wafer 40 from left to right in the figure, held in a wafer holder or base plate 42, delivering paste 44 at its leading edge. Paste 44 is moved into position by a moving support 46 in a channel or base plate slot 48 to which paste 44 is conducted by a passageway (not shown). As shown in FIG. 3C, excess paste is deposited over a movable support member 50 in a channel or base plate slot 52. As shown in FIG. 3D, support member 52 is moved upwards in channel 52, while support member 46 is moved downwards in channel 48. Additional paste is supplied to slot 52 through a second passageway (not shown). As illustrated in FIG. 3E and FIG. 3F, moving member 39 is then moved to cause squeegee blade 38 to again traverse wafer 40, while moving from right to left in the figure.

This method has a number of important shortcomings, the most important of which is that there is not sufficient constraint at the leading edge of the squeegee blade 38 to force the paste 44 to the bottom of a deep blind via in a single, or often, even multiple passes. Whether the paste 44 makes it to the via bottom is dependent on a number of factors including the viscosity of the paste 44, the down force on the squeegee blade 38, the quantity of paste 44 built up in front of the squeegee blade 38, and the blade speed. With respect to the down force, there is no method to fully contain the paste 44 under pressure over a blind via except when the squeegee blade 38 is passing directly overhead, and even then paste 44 is free to smear out both in front of and behind the blade 38.

This makes multiple passes a necessity. For high aspect ratio vias incomplete filling can occur if the vacuum level is not sufficiently low or if the paste 44 is of a very high viscosity. The method is also not well suited to semiconductor processing where substrates are round rather than rectangular. In order to ensure complete coverage of a round substrate, paste 44 must be pushed repeatedly onto and off of the base plate 42 holding the wafer. The linear motion of the squeegee blade 38 then leads to buildup at either end of the tool necessitating some method of regular cleaning, and a great waste of the conductive fill paste. Accordingly there is a need to develop a more efficient method for applying viscous conductive paste to semiconductor wafers containing blind vias.

In U.S. Pat. No. 5,244,143 to Ference et al. as well as U.S. Pat. No. 5,775,569 to Berger et al., a tool and method for filling a mold with molten solder are described. Since a mold is obviously a rigid plate containing etched regions of specific shapes, if these shapes take the form of cylinders then the problem is essentially one of filling blind vias. The filling head described in these patents is sealed against the mold surface such that a vacuum can be pulled in a region defined by a O-ring seal underneath the head. Molten solder is then delivered through a central slot in the head such that complete fill of the evacuated solder mold cavities is achieved in a single pass. An important distinguishing feature of this tool and method is that it works well only for very low viscosity materials such as molten solder which have a viscosity on the order of 2 centipoise (for comparison water is by definition 1 centipoise). The conductive pastes used for semiconductor applications by contrast have much higher viscosities ranging from 1,000 centipoise to greater than 50,000 centipoise and thus require much higher internal pressures for them to be effectively delivered to the wafer surface and into the blind vias etched therein.

A via filling method using a pressurized paste nozzle is described in U.S. Pat. No. 6,506,332 to J. L. Pedigo and it is clear that while this method has advantages over the squeegee method described by Okuno, it is primarily intended for use in organic printed circuit board (PCB) high-density interconnect (HDI) and sequential build up (SBU) laminate board type applications. The apparatus described makes use of a pressure head in combination comprising an O-ring gasket which is held against the electronic substrate to be filled and moved relative to that substrate such that paste is forced into the via holes as the head passes overhead. The apparatus as described has a number of shortcomings which limit its applicability for use with silicon wafer based packaging. Specifically, the method does not employ vacuum which is a practical necessity for complete filling of small, high aspect ratio blind vias. Instead, the method is described as a means of obtaining "reduced numbers of air pockets formed in the via fill paste while decreasing the amount of processing required per board". Further, via sizes claimed range from 2 to 25 thousands of an inch (mils) in diameter, a span which covers most important electronic wiring board applications, but which neglects via features smaller than 50 um (2 mils) in diameter which are easily attainable in package substrates made from silicon where blind vias may be on the order of 10 um in diameter with aspect ratios greater than 10:1. Filling such small blind features with viscous paste without the aid of vacuum is highly problematic if not impossible.

SUMMARY OF THE INVENTION

The present inventors have recognized that there is a need for a method and tooling which employs a combination of pressurized paste delivery in a vacuum environment to enable the complete filling of etched blind features, both lines and vias, in a silicon wafer which may range in size from 10 um (<0.5 mils) to 250 um (10 mils). Furthermore, there is a need for a highly manufacturable process and tooling which is easily adaptable for highly automated batch operation compatible with CMOS back end of the line (BEOL) processing.

It is therefore an aspect of the present invention to provide a method for reliably filling vias with a viscous substance.

It is another aspect of the present invention to provide apparatus or tooling for reliably filling vias with a viscous substance.

In accordance with the invention a method for filling vias, and in particular blind vias, in a wafer, comprises evacuating air from the vias; trapping at least a portion of the wafer and a paste for filling the vias between two surfaces; and pressurizing the paste to fill the via. The method may further comprise forming a seal between the surfaces so as to enclose the portion of the wafer and the paste. The method may further comprises moving the seal over successive portions of the wafer to fill the vias.

Further, the method may comprise placing the paste on a planar surface facing the wafer; and moving the planar surface upon which the paste is placed into contact with the wafer. The paste may be injected between one of the surfaces and the wafer. Preferably, the paste is injected between one of the surfaces and the wafer after evacuating the air from the vias.

The method may further comprising providing an evacuated space between the surfaces; and forcing the surfaces together to force the paste into the vias. The surfaces can forced together by atmospheric pressure.

Preferably, the paste is pressurized to greater than atmospheric pressure, and more specifically to a pressure in the range of 10 to 100 PSI.

In accordance with the invention, an apparatus for filing vias in a wafer, comprises a chamber in which to place the wafer, the chamber being capable of being evacuated; a surface upon which to place the wafer; a paste delivery portion for providing a paste to fill the vias; and a paste filling portion for bringing the paste into contact with the vias under pressure so that the paste fills the vias. Preferably, the paste filling portion provides the paste at a pressure with the range of 10 to 100 PSI.

The paste delivery portion may comprise a surface onto which the paste is deposited; and a mechanism for applying pressure so that the paste on the surface is forced into contact with the wafer. The paste delivery portion may also comprise a surface onto which the paste is deposited; and a passageway through which the paste is delivered to the surface. The mechanism for applying pressure may comprise a plate which defines the surface; and components for applying a pressure differential to the plate so as to force the plate toward the wafer. A compliant material may be disposed on the surface to which the paste is applied.

The paste filling portion may comprise a plate having a portion for receiving the paste; a first seal for sealing the plate to the surface upon which the wafer is placed; a second seal for sealing the paste between the plate and the plate and the wafer; and a mechanism for forcing the plate towards the wafer so that the paste is forced into the vias of the wafer.

The mechanism for forcing the plate towards the wafer may comprise a gas removal apparatus for evacuating gas between the plate and the surface upon which the wafer is placed; and gas replacement apparatus for replacing gas evacuated from the chamber. The gas replacement apparatus may comprise an opening through which gas is permitted to enter the chamber.

The surface upon which to place the wafer may comprise a base plate having a recess for the wafer or it may be a surface of an electrostatic chuck.

The paste delivery portion may comprise a pressurized paste reservoir.

Also in accordance with the invention, the paste filling portion may comprise a piston housing having an opening for receiving a piston; a compliant seal for sealing the piston housing to a portion of the wafer so as to confine the paste; a piston disposed in the piston housing; and a piston actuator for forcing the piston toward the wafer; wherein the paste delivery portion provides the paste to the opening.

The apparatus in accordance with the invention may further comprise a mechanism for moving the piston housing so that the seal is compressed for filing the vias. The mechanism for moving the piston housing may further move the piston housing to a position wherein the seal is compressed to a lesser degree than when the vias are filled, to thereby allow the piston housing to be moved so that the piston housing is disposed so as to be in a position to fill vias of one or more successive portions of the wafer with paste delivered to the opening.

The apparatus may further comprise a mechanism for cleaning the piston of excess paste after vias of a wafer have been filled.

The paste filling portion of the apparatus may comprise an elongate member having a surface with a slot through which paste is provided to the wafer; and a compliant seal for sealing the surface to the wafer.

In accordance with the invention, the apparatus may further comprise a mechanism for translating the member and the wafer with respect to one another so as to fill vias in successive portions of the wafer and a mechanism for rotating the member and the wafer with respect to one another so as to fill vias in successive portions of the wafer. The mechanism for rotating the member and the wafer with respect to one another may comprise a rotating base having the surface upon which the wafer is placed.

The apparatus may be configured to accept a circular wafer, wherein the elongate member is disposed radially with respect to the wafer. Preferably, the elongate member has a length less than that a radius of the wafer, and the further comprises a mechanism for rotating the wafer; and a mechanism for radially translating the member in a radial direction with respect to the wafer. The mechanism for rotating the wafer may include a rotation speed control to control speed of rotation of the wafer. The mechanism for radially translating the member may include a translation speed control to control speed of translation of the member with respect to the wafer.

The mechanism for radially translating the member may include a worm gear assembly, and a motor for rotating a drive shaft of the assembly.

BRIEF DESCRIPTION OF THE DRAWINGS

These and other aspects, features, and advantages of the present invention will become apparent upon further consideration of the following detailed description of the invention when read in conjunction with the drawing figures, in which:

FIG. 1A to FIG. 1F illustrate, in cross sections, the stages of a prior art process flow for creating a silicon-based chip carrier complete with conductive through vias, topside landing joins or bumps and backside solder connections.

FIG. 3C illustrates the system of FIG. 3A with the vacuum squeegee blade at a terminal position after a single pass.

FIG. 5F is a cross-sectional view of the apparatus of FIG. 5A wherein the piston head is in a second location, while maintaining a light contact force between the gasket and the surface of the wafer.

FIG. 6A is a partial bottom view of an apparatus in accordance with a third embodiment of the invention.

FIG. 6B cross-sectional side elevational view of the apparatus of FIG. 6A.

FIG. 9A, FIG. 9B and FIG. 9C are plan views of rotary nozzle dispense operations inside of a vacuum environment, utilizing an apparatus in accordance with FIG. 6A and FIG. 6B.

DESCRIPTION OF THE INVENTION

Variations described for the present invention can be realized in any combination desirable for each particular application. Thus particular limitations, and/or embodiment enhancements described herein, which may have particular advantages to the particular application need not be used for all applications. Also, it should be realized that not all limitations need be implemented in methods, systems and/or apparatus including one or more concepts of the present invention.

Figure 2:
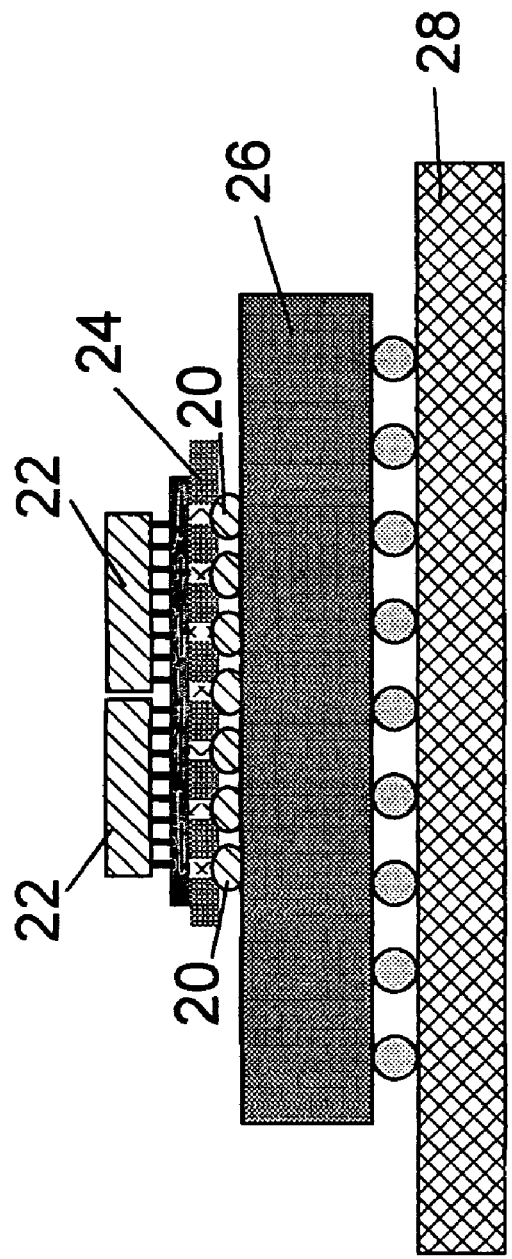
FIG. 2 illustrates prior art silicon based carrier populated with chips mounted on a first (ceramic module) and second (PCB) level package.
Figure 3A:
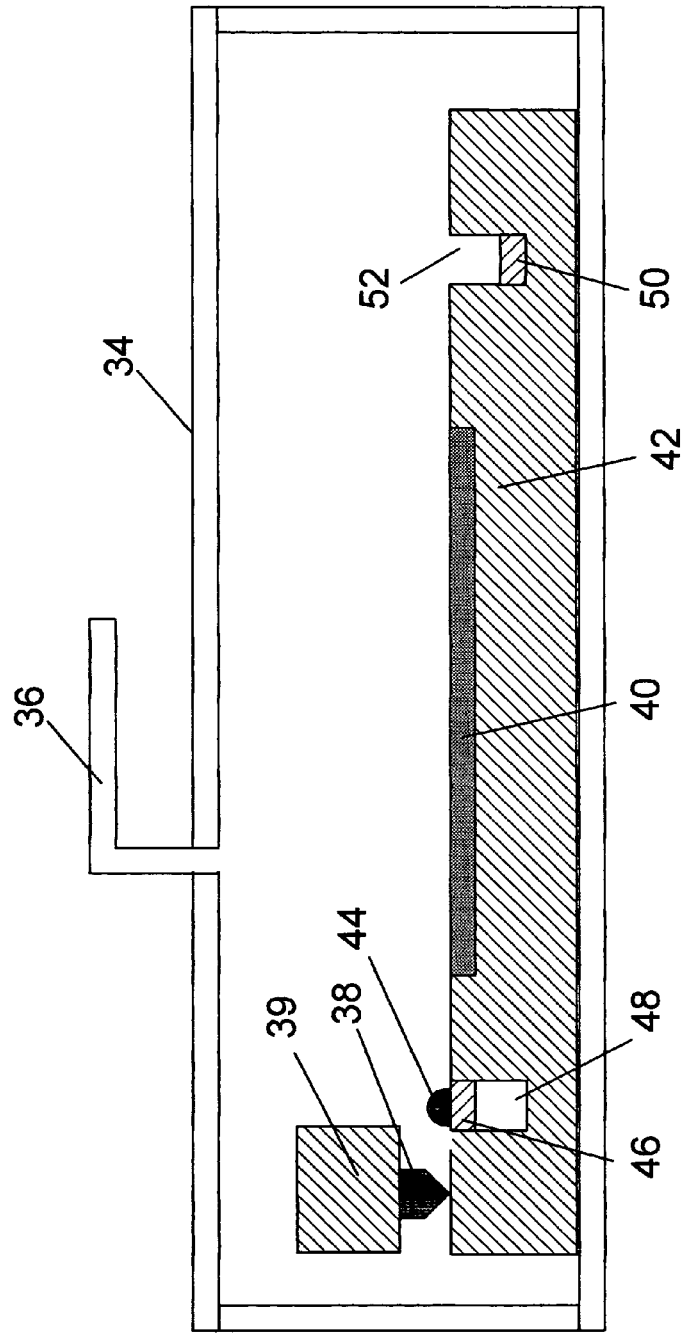
FIG. 3A illustrates a prior art system using paste delivery through a base plate slot with a vacuum squeegee blade at a home position.
Figure 3B:
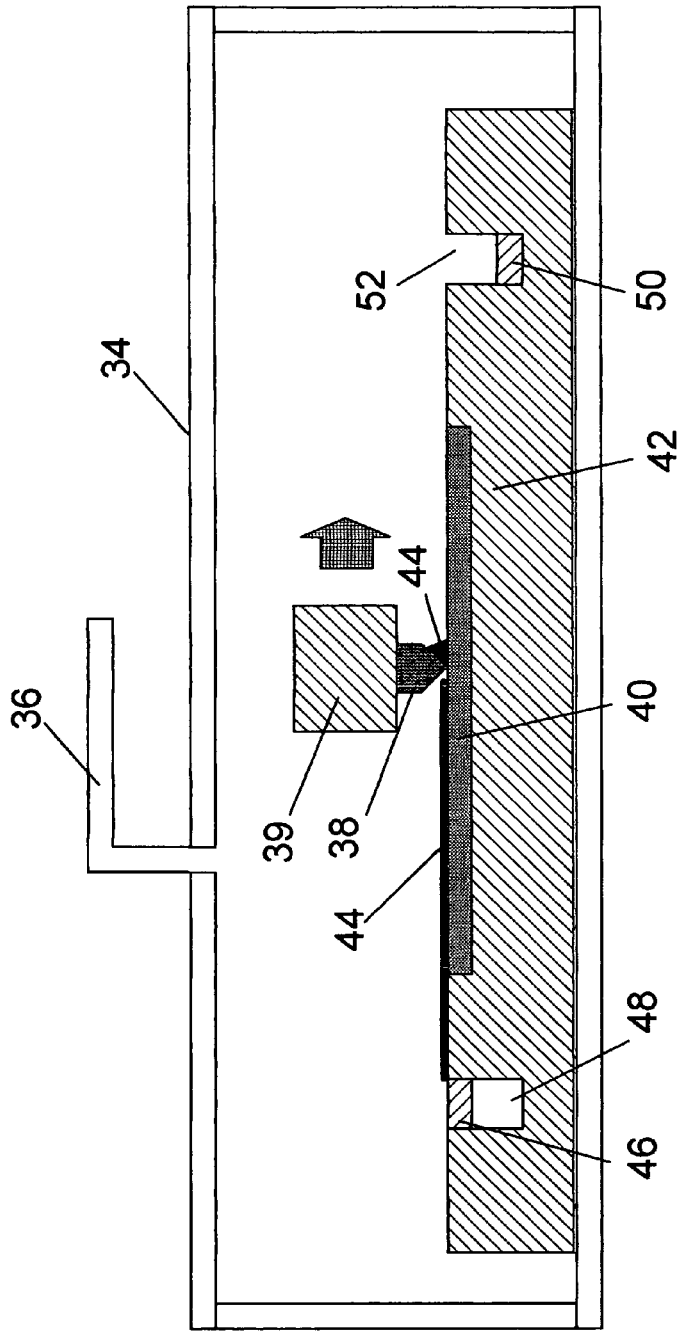
FIG. 3B illustrates the system of FIG. 3A with the vacuum squeegee blade at a midway position during a first pass paste filling.
Figure 3D:
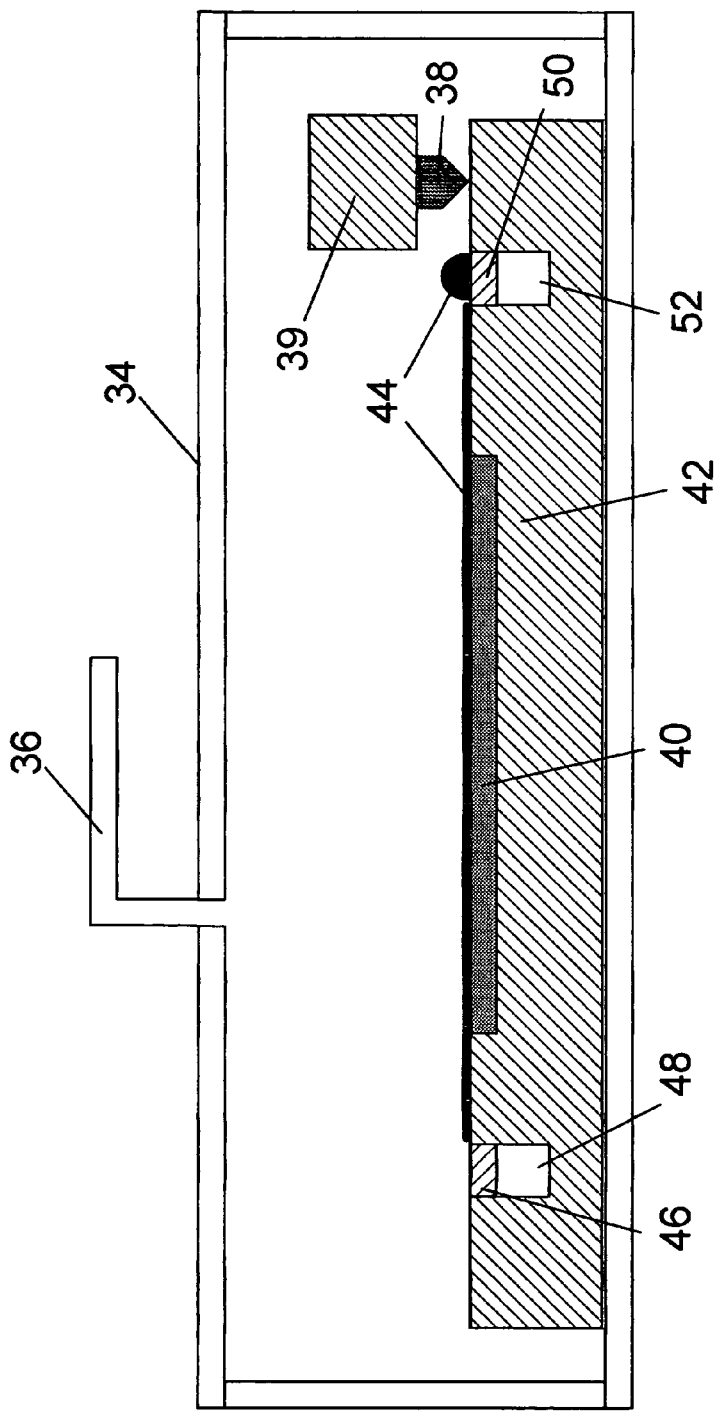
FIG. 3D illustrates the system of FIG. 3A with paste delivery through a base plate slot with the vacuum squeegee blade at terminal position.
Figure 3E:
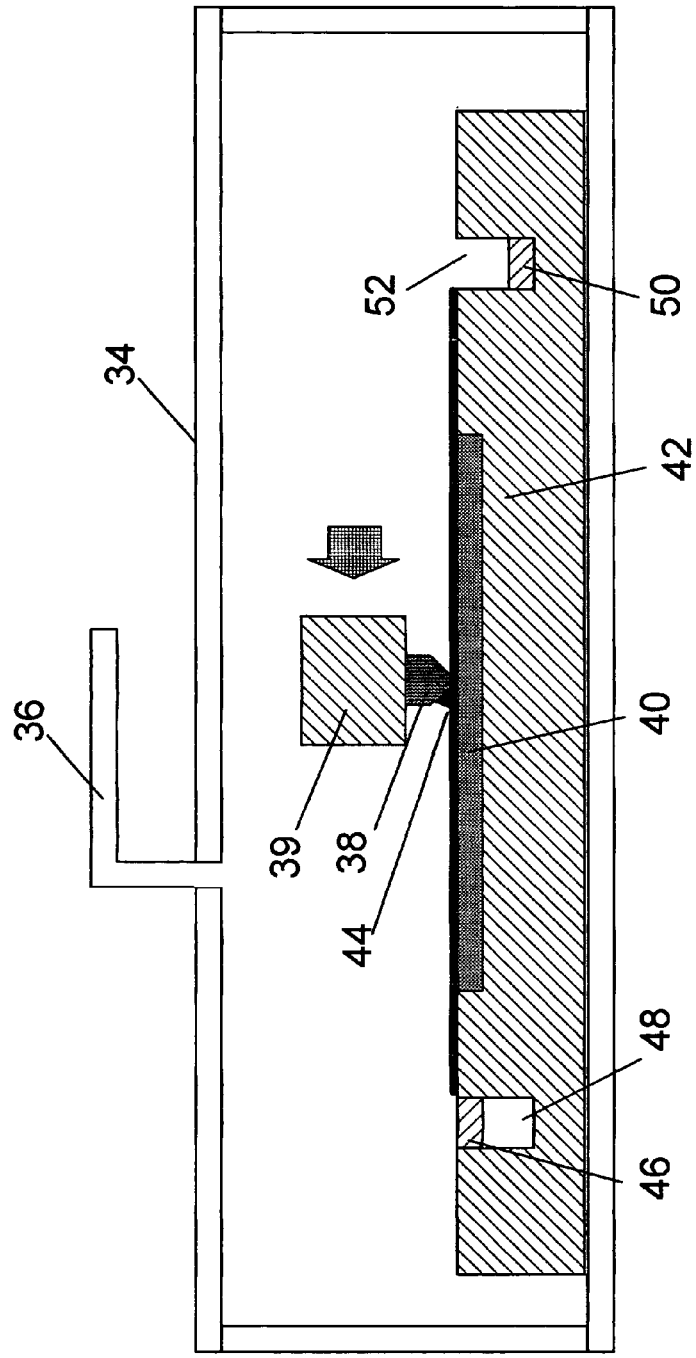
FIG. 3E illustrates the system of FIG. 3A with the vacuum squeegee blade at a midway position during a second (return) pass paste filling.
Figure 3F:
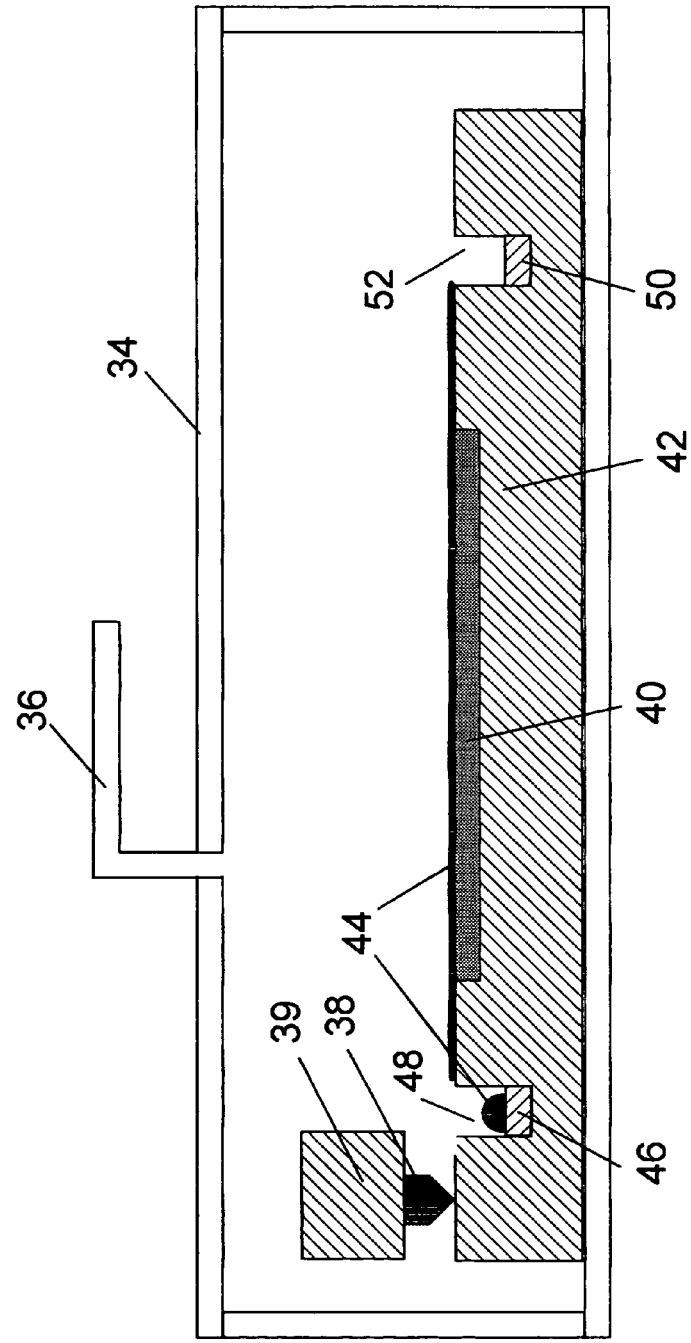
FIG. 3F illustrates the system of FIG. 3A with the vacuum squeegee blade at a home position after one complete cycle including two passes across the surface of a wafer.
Figure 4A:
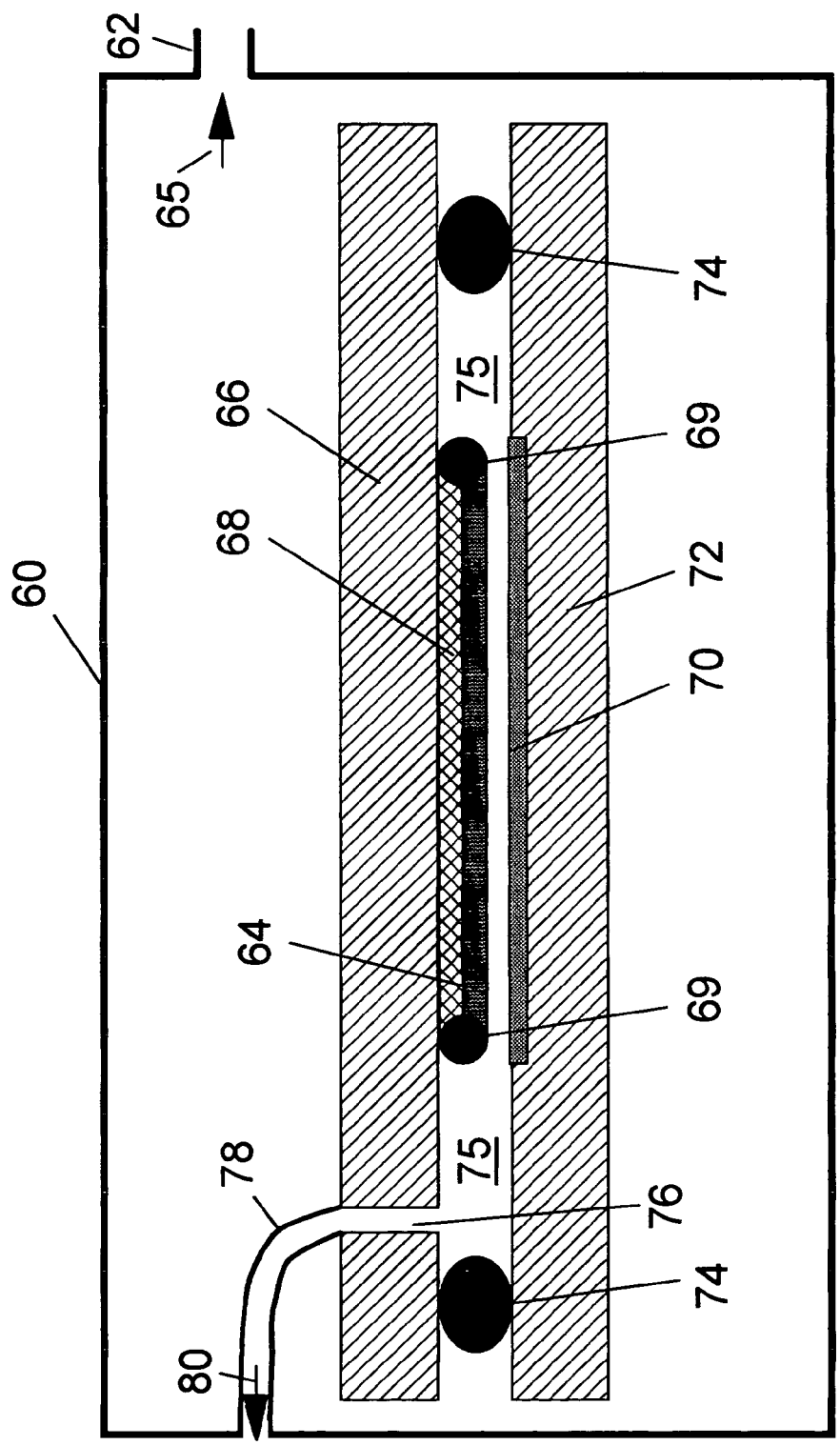
FIG. 4A illustrates an apparatus in accordance with the invention with a vacuum piston tool having an upper surface coated with paste, in an initial position.

Referring to FIG. 4A, in a first apparatus and method in accordance with the invention, an outer processing chamber 60 has an outer vacuum port 62 to which a vacuum source (not shown) is connected. Chamber 60 is evacuated, as represented by arrow 65, through port 62. Conductive paste 64 is applied to a portion of one face of a top plate or piston 66, which is coated with Teflon or another nonstick and compliant surface material 68.

As used herein, the term paste refers to any material, and especially to electrically conductive materials, having a viscosity within a broad range, including a range spanning that of traditional pastes, such as highly loaded metal or metal-dielectric filled pastes used in screen printing of printed circuit boards, aqueous suspensions containing fine grains of conducting material, and organo-metallic liquids.

An inner O-ring 69 surrounds the surface material and the paste 64. The wafer 70 being processed is held on the face of a bottom or base plate 72 by means of a countersunk recess or banking pins (not shown). The planar surfaces of piston 66 and base plate 72 are held apart by a by a compliant outer O-ring 74. Air in the gap separating the paste-coated side from the wafer, is prevented from being trapped in the vias under the paste by achieving a sufficient vacuum in the space 75 between piston 66 and base plate 72. This is accomplished by evacuating space 75 by means of a passageway 76 in piston 66, which is connected to a vacuum hose 78, that is in turn evacuated by a vacuum system (not shown) connected to an inner vacuum port 80. Thus, in FIG. 4A, the inner vacuum port 80 and the outer vacuum port 62 are both open so that the space 75 between the paste 64 and the wafer 70 is evacuated without collapse of the plates toward one another.

Figure 4B:
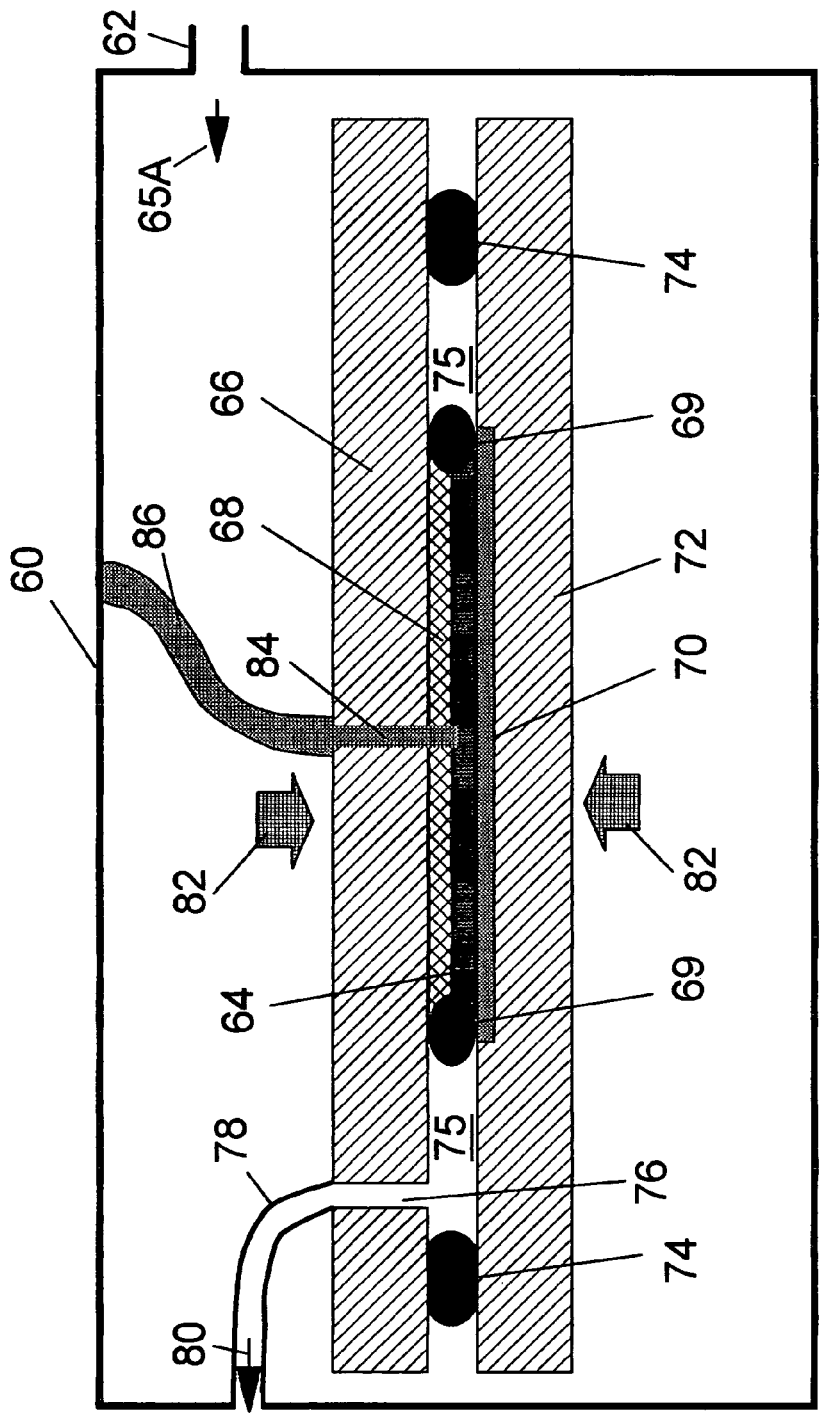
FIG. 4B illustrates the apparatus of FIG. 4A in a configuration wherein an inner vacuum port of the is held open while an outer vacuum port back fills to atmosphere.

Pressure is then applied to the piston 66, bringing the paste into contact with the wafer 70. As shown in FIG. 4B this pressure, represented by arrows 82 is easily achieved by maintaining vacuum inside the piston enclosure defining space 75, while back filling the outer chamber 60 with air, for example, at atmospheric pressure, as represented by arrow 65A. The inner O-ring 69 forms a baffle enclosure, preventing the paste from escaping at the edge of the wafer 70 and assuring that sufficient pressure is available to force the paste into the evacuated vias of wafer 70. Once the vacuum is released from the inner piston, by releasing the vacuum at inner vacuum port 80, and allowing space 75 to revert to, for example, atmospheric pressure, with arrow 80A representing the flow of air, outer O-ring 74 provides a restoring force which increases the separation between piston 66 and base plate 72, as shown in FIG. 4C.

Figure 4C:
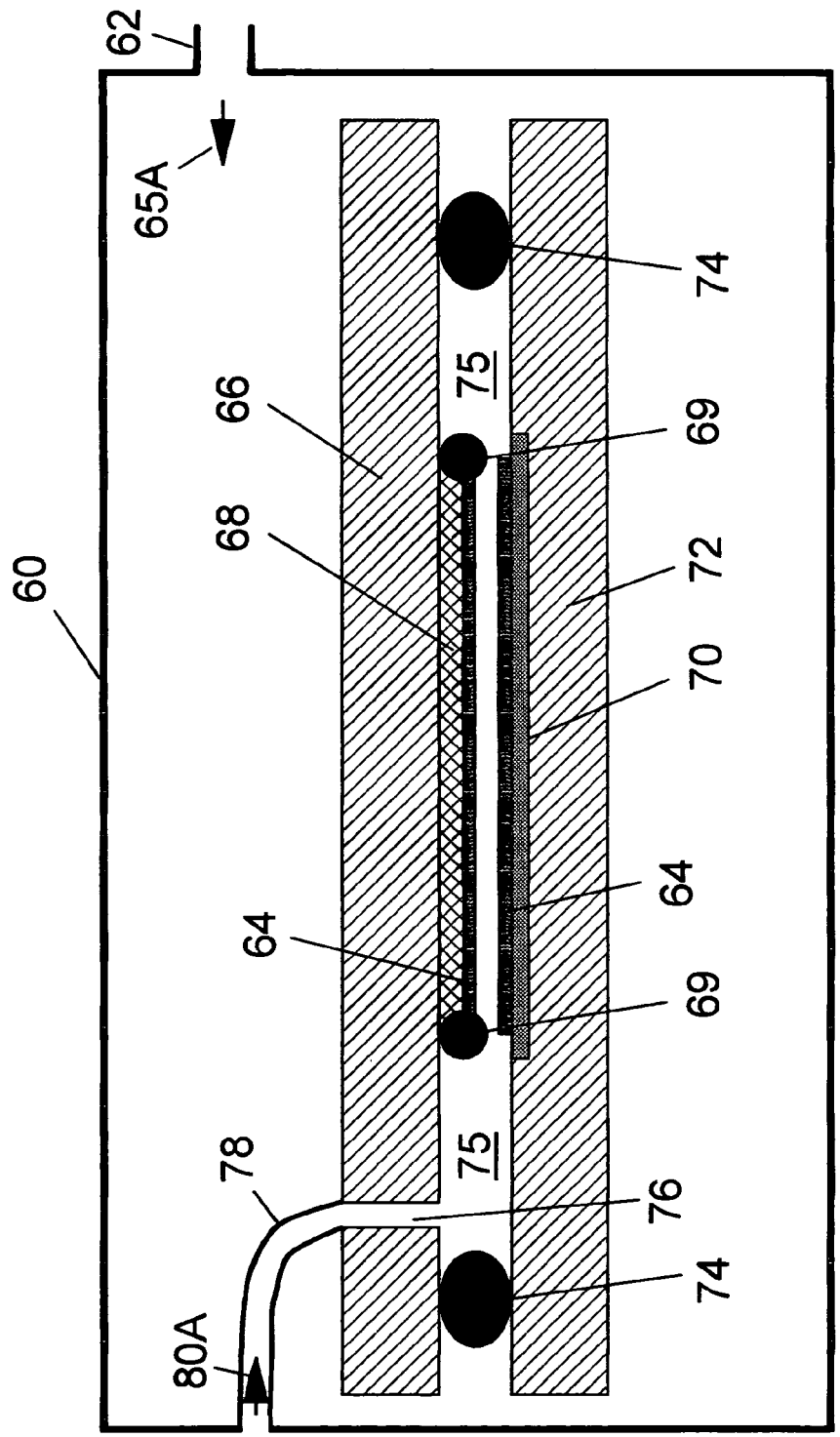
FIG. 4C illustrates the apparatus of FIG. 4A in a configuration wherein the inner port is set to back fill to atmosphere so that a paste is in the vias of the wafer and an overburden is on the wafer surface.

Several additional features are available for the apparatus illustrated in FIG. 4A to FIG. 4C. In the case of a lower viscosity liquid paste, as shown in FIG. 4B, delivery may be achieved via an orifice 84 in the piston 66 and surface material 68 after the vessel is evacuated. In this case a precise amount of paste is delivered, through a preferably flexible paste delivery tube 86 (which may penetrate chamber 60 in an airtight manner) and allowed to flow across the wafer surface and into the evacuated vias before final pressure is applied. In an alternate embodiment, the wafer mounting surface and paste-covered surface are inverted. In this case, the automatic dispensing of the paste takes place through an orifice in the lower plate, and a lower-viscosity paste is allowed to pool for a precise time before the wafer is brought into contact and pressure applied. This may be visualized by inverting FIG. 4B. In this embodiment, paste overburden must be removed in a subsequent step by any number of methods including but not limited to a squeegee or doctor blade as described above, or a rotary brush cleaning method.

Figure 5A:
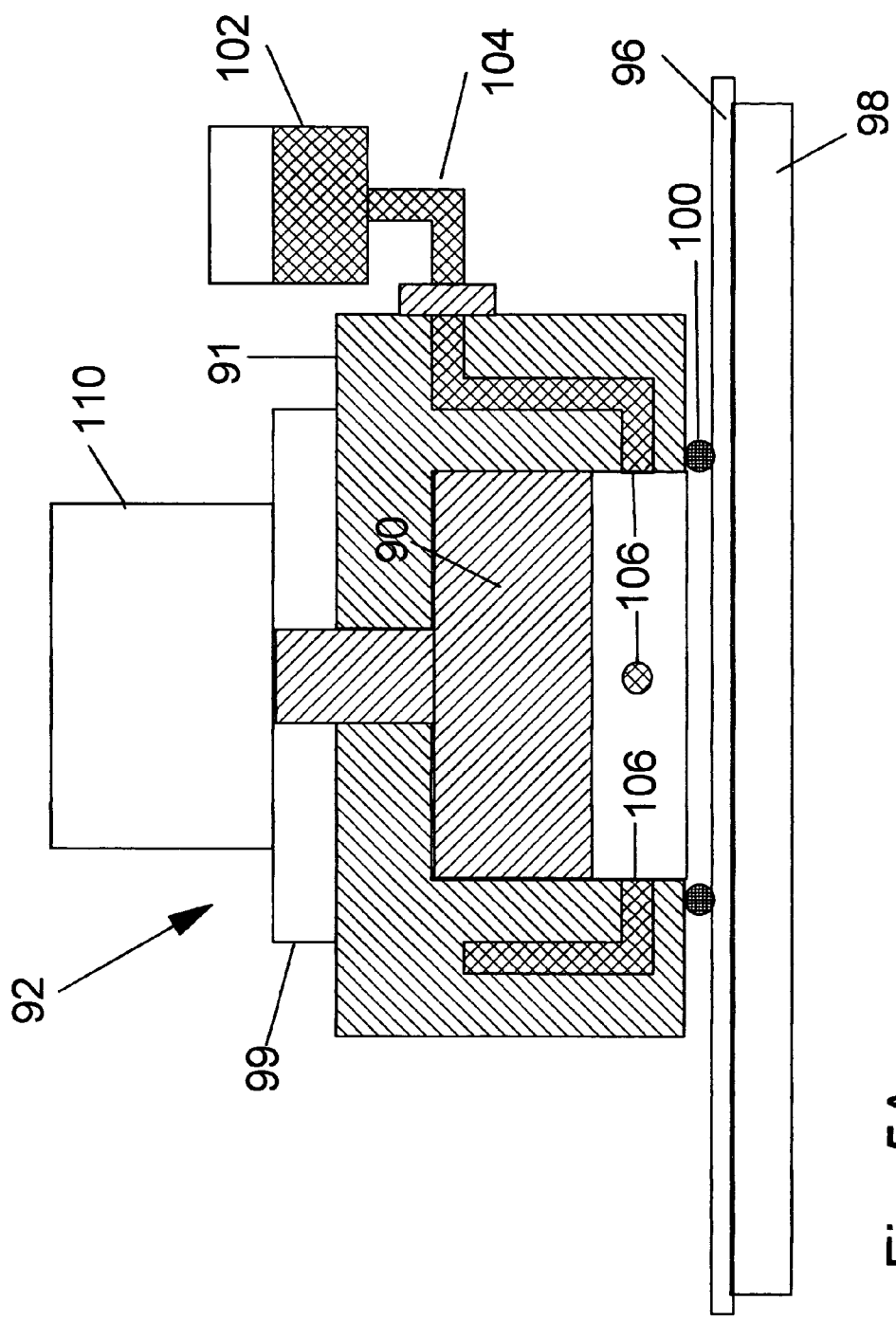
FIG. 5A is a cross-sectional view of an apparatus in accordance with a second embodiment of the invention wherein a compact piston head is in a starting position on the surface of a wafer.
Figure 5B:
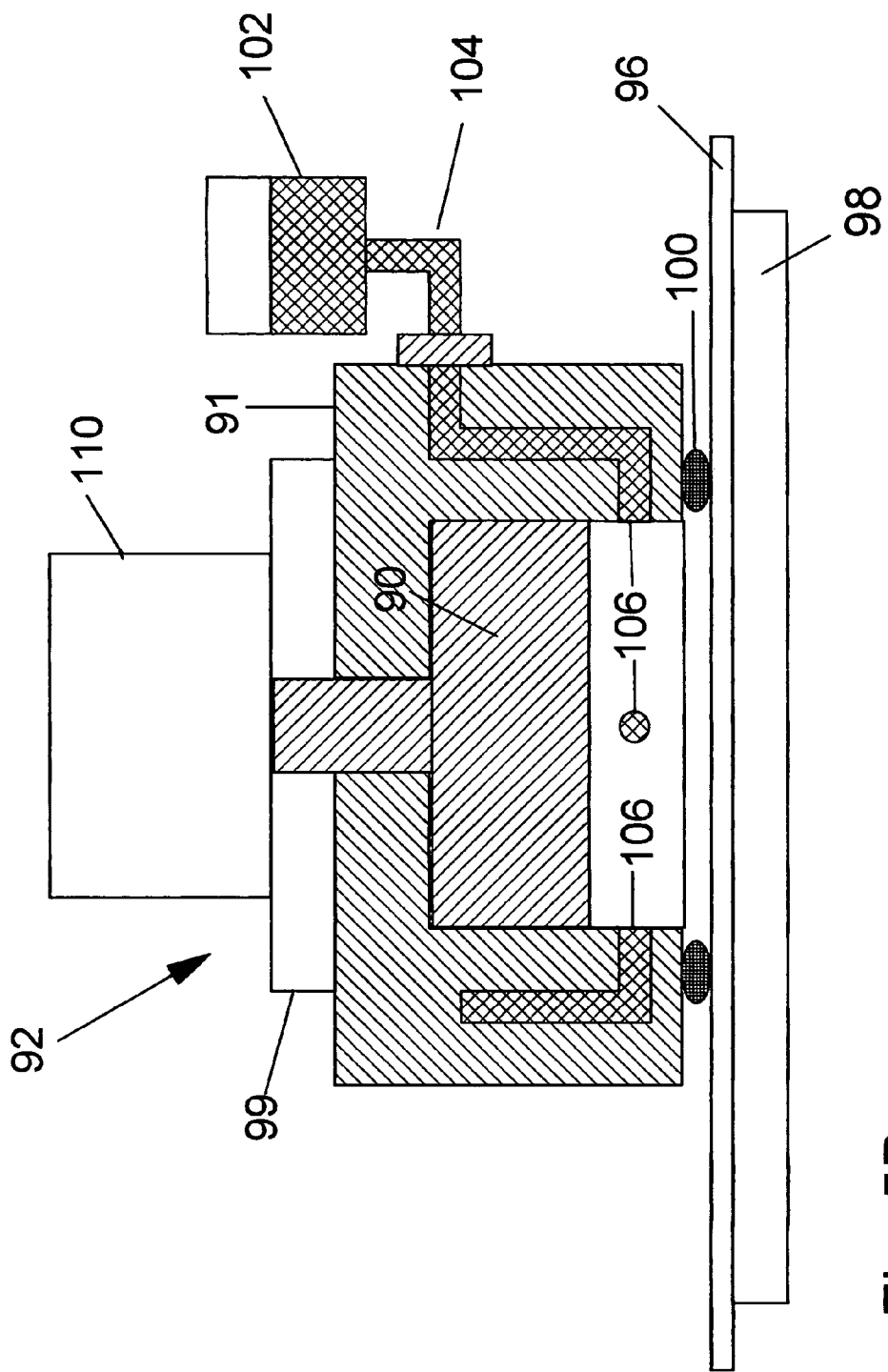
FIG. 5B is a cross-sectional view of the apparatus of FIG. 5A wherein the compact piston head is moved so as to compress a gasket against the wafer.
Figure 5C:
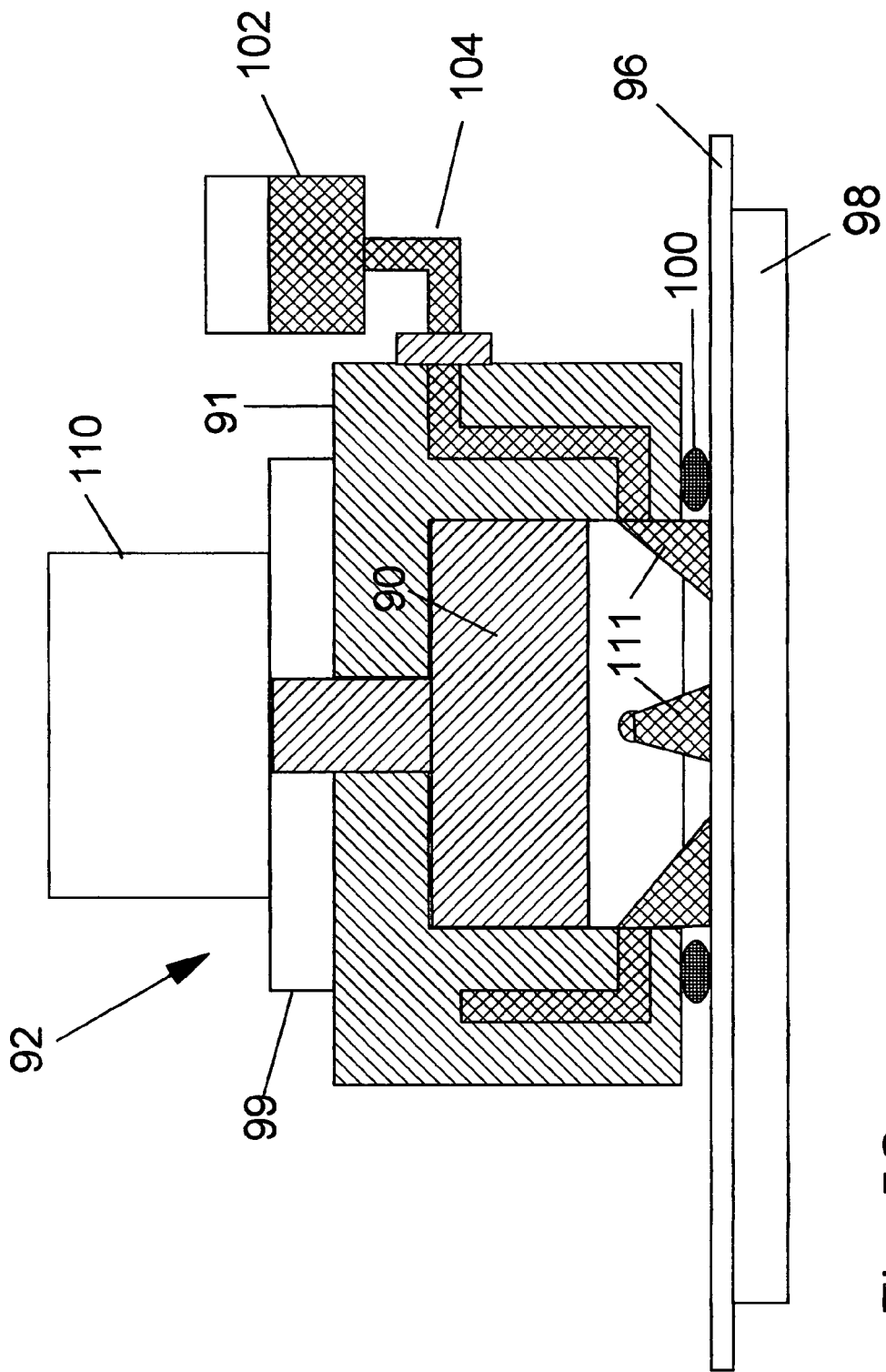
FIG. 5C is a cross-sectional view of the apparatus of FIG. 5A wherein paste is dispensed into an evacuated region between the piston face and the wafer surface.

Referring to FIG. 5A to FIG. 5F, in the second embodiment of the invention, a compact piston 90 is disposed in a piston housing 91, of a movable, compact, operating piston head 92. Piston head 92 is disposed inside a vacuum chamber 94. Provision is made to move the compact piston head 92 in steps across the surface of a wafer 96 held in, for example, an electrostatic chuck 98. The filling begins once the chamber 94 is fully evacuated. As illustrated in FIG. 5B, the piston head 92 is moved to an appropriate starting point (FIG. 5a) and the piston housing 91 is pushed vertically against the wafer surface, by for example, vertical expansion of an actuator 99, to compress an O-ring gasket 100. As illustrated in FIG. 5C, paste, stored in a pressurized paste feed and reservoir 102 is dispensed into the evacuated space 108 underneath the compact piston through a paste feed tube or hose 104 terminating in an opening 106 in the space 108 under piston 90 and above wafer 96.

Figure 5D:
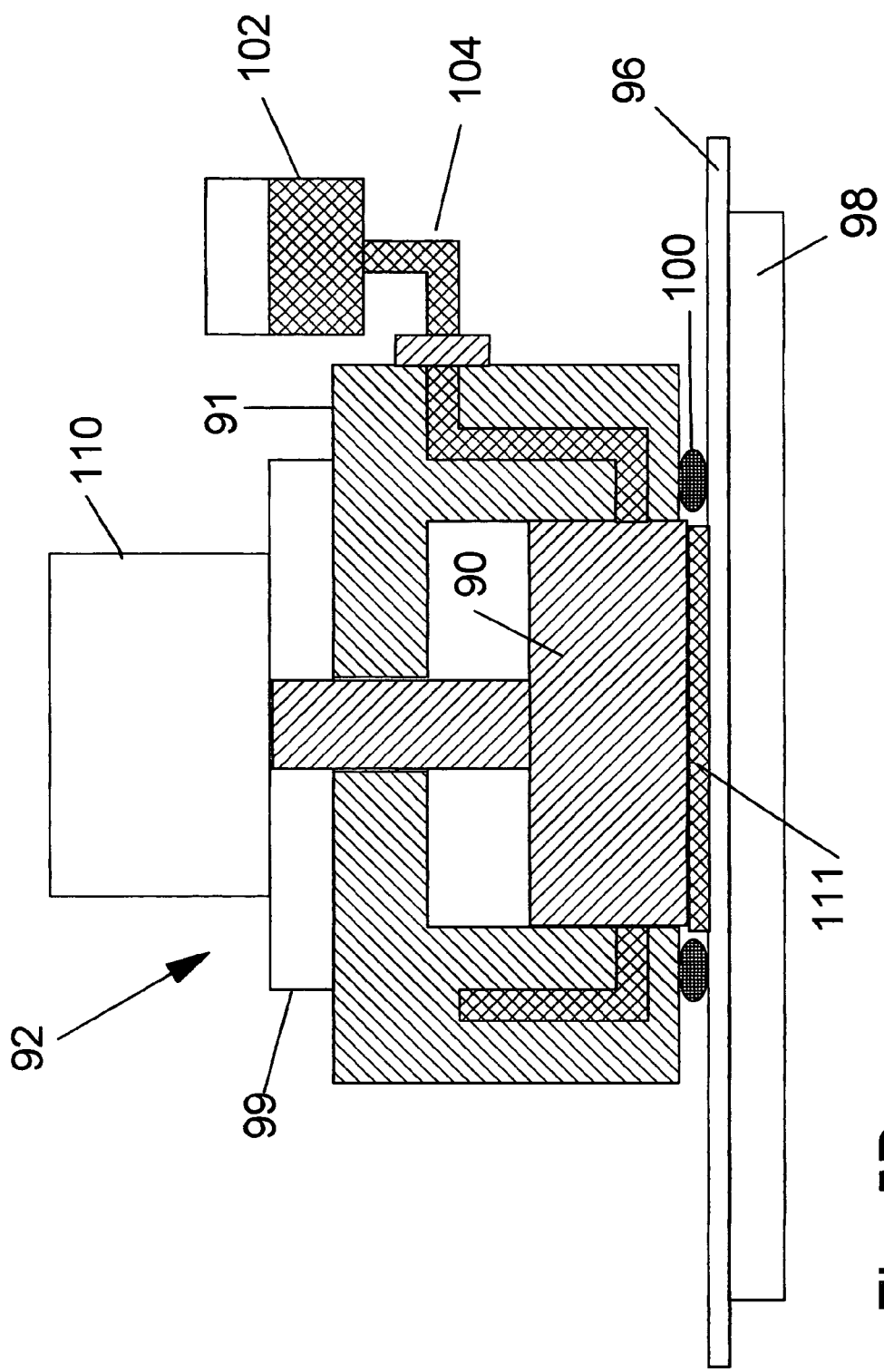
FIG. 5D is a cross-sectional view of the apparatus of FIG. 5A wherein the piston extends downward compressing paste into blind vias of the wafer.
Figure 5E:
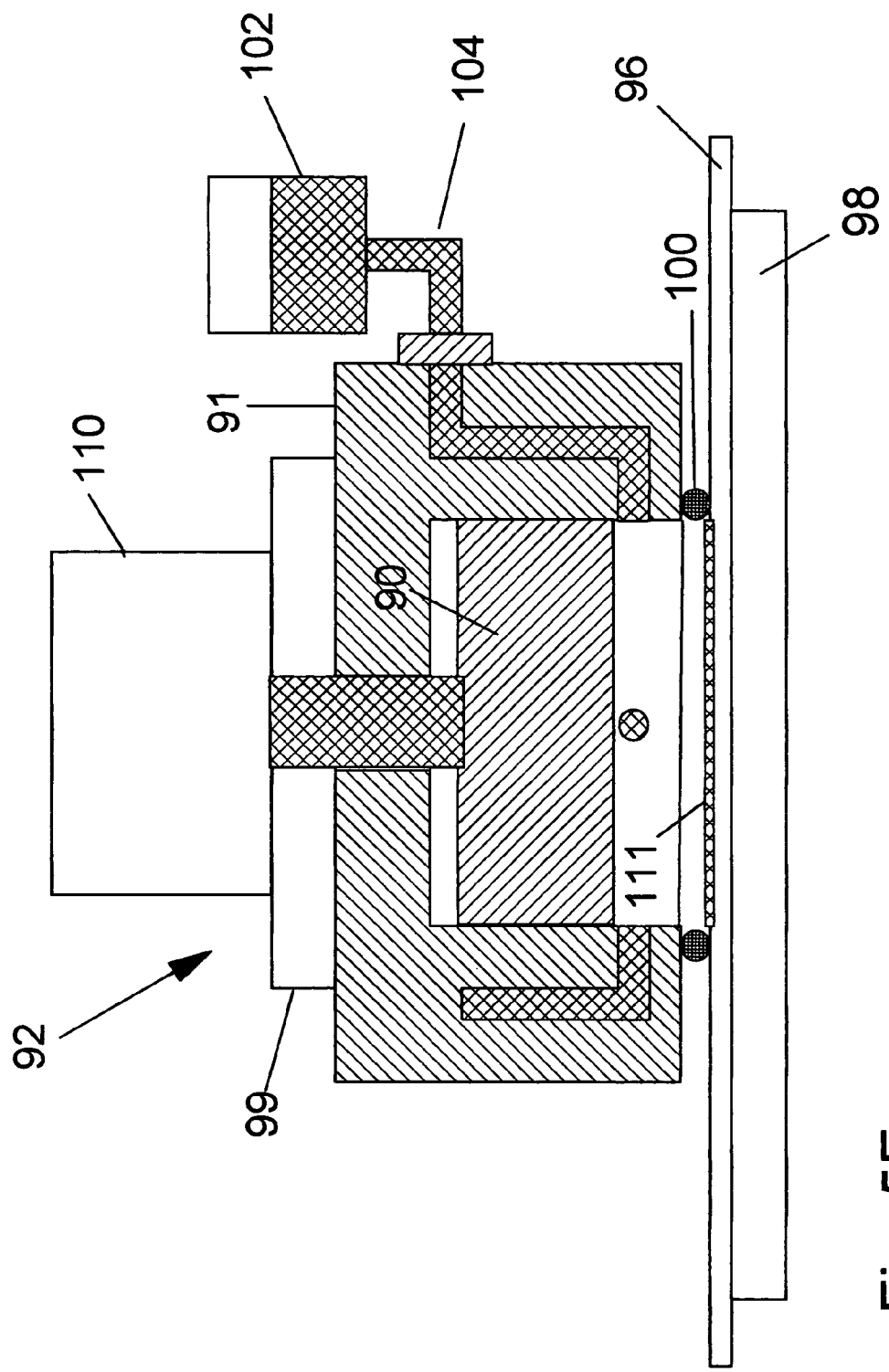
FIG. 5E is a cross-sectional view of the apparatus of FIG. 5A wherein the piston is withdrawn and the piston head is in a position resulting in light pressure between the gasket and the surface of the wafer.
Figure 5G:
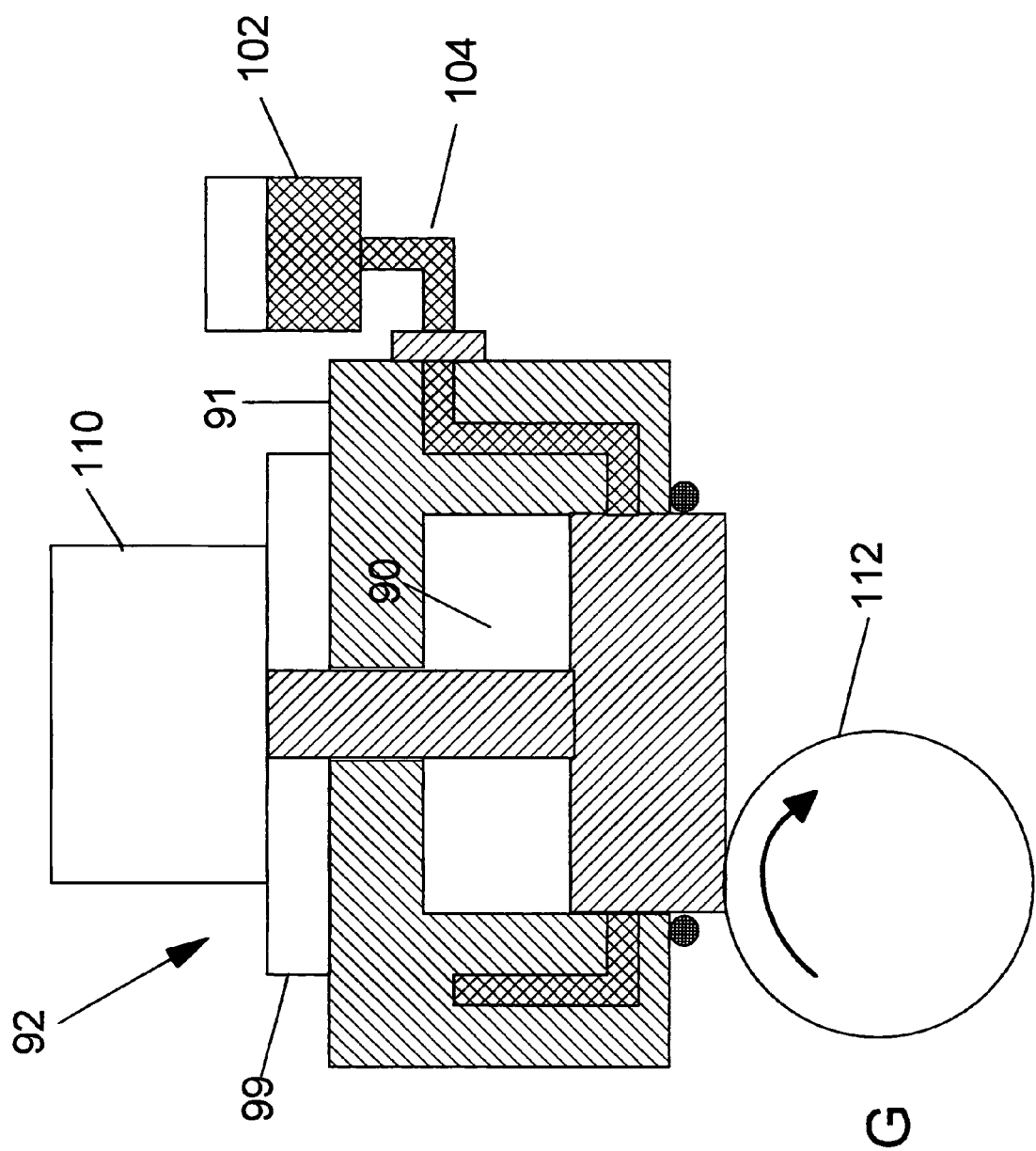
FIG. 5G is a side elevational view of the piston head apparatus of FIG. 5A wherein the piston is at location away from the wafer surface and extends to contact apparatus for removing excess paste.

As illustrated in FIG. 5D, the piston 90 is then actuated by a piston drive mechanism 110, which forces piston 90 downward, thus compressing the paste into the vias of wafer 96 below. Piston drive mechanism 110 may be operated in any of several conventional ways, such as by means of an electric motor or a pneumatic or hydraulic drive. Drive mechanism 110 may then be reversed so that piston 90 withdraws. The downward force of the piston housing 91 of head 92 is released by actuator 99, so that O-ring gasket 100 decompresses but remains lightly in contact with the upper surface of wafer 96. As illustrated in FIG. 5F, the entire head 92 is translated across the surface of the wafer 96 to the next delivery location and the process described above is repeated. This may be done at successive locations until vias in the entire wafer accessible by the head are filled. This method is advantageous in that it becomes quite easy to deliver the paste directly to the point of use. Further, as illustrated in FIG. 5G, it is relatively simple to include a cleaning station, comprising, for example, a rotating cleaning wheel 112, located away from the wafer chuck 98, to remove excess paste from the bottom of the compact piston face before subsequent filling. To perform this operation, head 92 is moved to a position removed from chuck 98, and piston drive mechanism 110 moves piston 90 so that its lower surface extends outside of piston housing 91 and below O-ring gasket 100.

It is noted that while the face of piston 90 may be circular, it is advantageous for it to be a square or rectangular in the case of a x-y translation system. In the case of a rotational system where the head is fixed and the wafer rotates, it is advantageous for the head to assume a shape equal to some reasonable segment of a circle.

Figure 7:
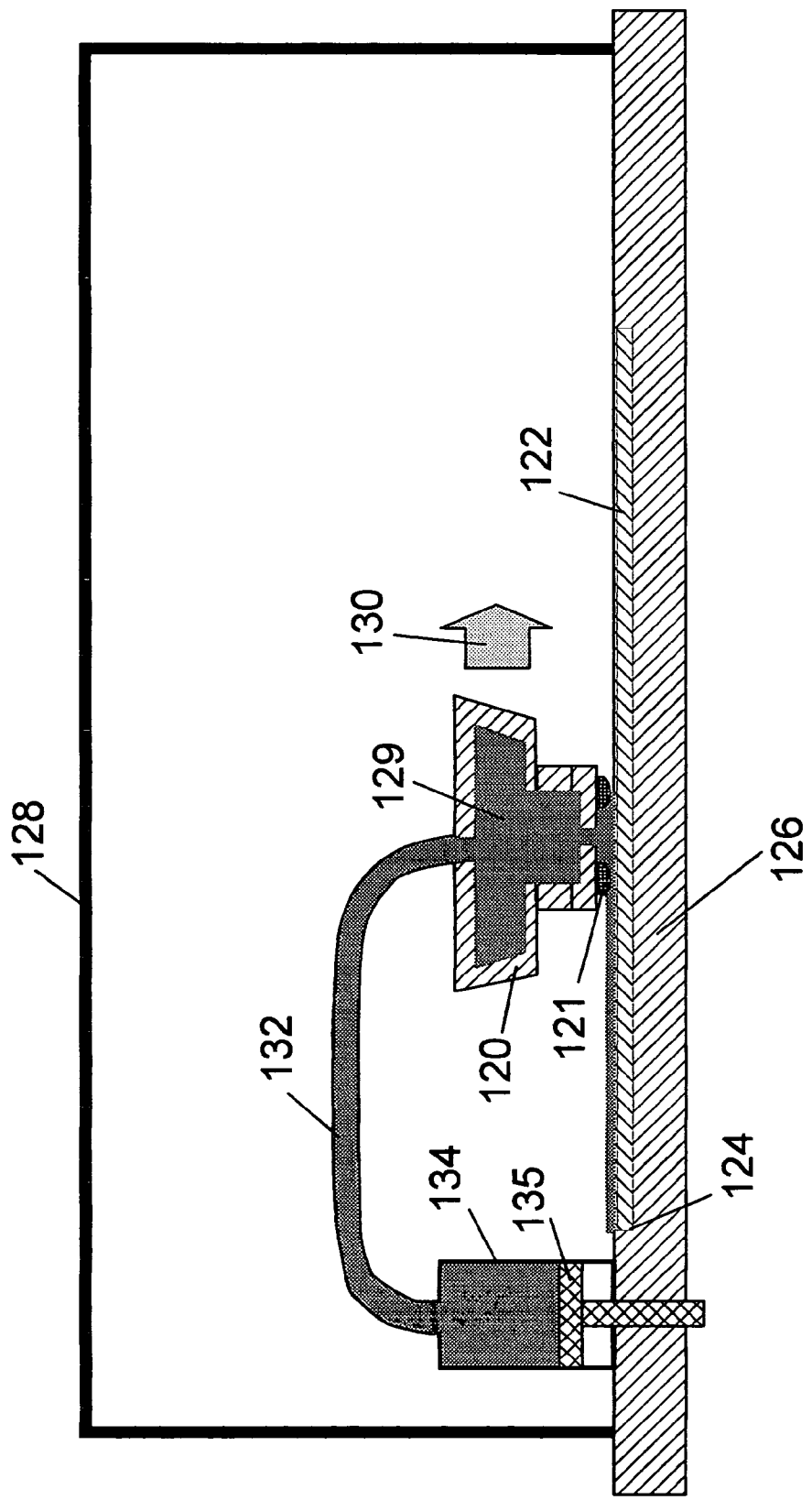
FIG. 7 is a cross-sectional view a vacuum paste nozzle dispense chamber, utilizing the apparatus of FIG. 6A and FIG. 6B.

Referring to FIG. 6A (a partial bottom view), FIG. 6B (a cross-sectional view) and FIG. 7, a cross sectional view), in a third embodiment of the invention, paste is applied using a pressurized nozzle 120, having an O-ring seal or gasket 121 held firmly in contact with the upper surface of a wafer 122. Wafer 122 is supported in a countersunk notch or recess 124 of a base plate 126 inside a vacuum environment, such as a vacuum chamber 128. Conductive paste 129 is applied through a slot 131. In FIG. 7, nozzle 120 is shown moving across wafer 122 in the direction of arrow 130. As with the first and second embodiment, no filling occurs until the entire chamber 128 has been pumped down to a vacuum level of less than 10 Torr, and preferably closer to 1 Torr. Conductive paste, under pressure, is supplied to nozzle 120 via a delivery tube 132 connected to a paste reservoir 134, which supplies paste upon movement of a piston assembly 135. An advantage of this embodiment is that the pressurized paste cartridge supplying the paste to the nozzle via the delivery tube is disposed inside the vacuum chamber and may be electronically or mechanically actuated therein. In this configuration there is no possibility of air seeping into the paste delivery system, and provision is made for preventing air from slowly permeating the paste itself, which is of critical importance for pastes which have been purposefully mixed and dispensed under vacuum specifically for this application.

Figure 8:
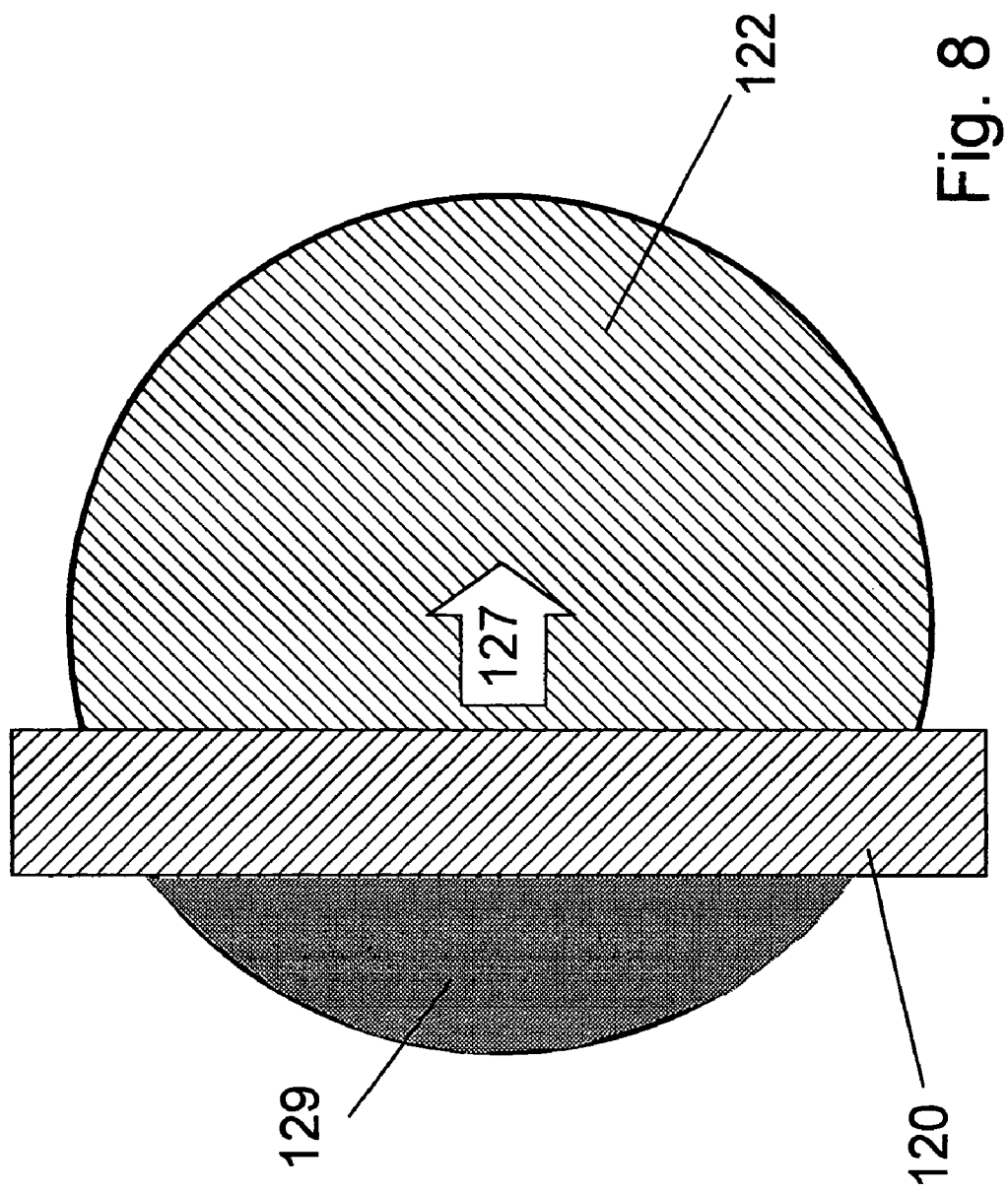
FIG. 8 is a plan view of a linear nozzle dispense operation inside of a vacuum environment, utilizing the apparatus of FIG. 6A and FIG. 6B.

Referring also to the linear scanning operation shown in FIG. 8, the nozzle 120 begins at a position to the left of the wafer 122 held in countersunk recess 124 of base plate 126 (FIG. 7), and travels as indicated by arrow 127. It is preferable that recess 124 either match, or be slightly less deep than, the full thickness of wafer 122 to ensure that the upper surface of wafer 122 is either on grade, or slightly higher (~1 mil) than, the surface of the base plate over which nozzle 120 moves. This ensures that the compliant nozzle O-ring gasket 121 will remain in compressed contact against the upper surface of wafer 122 throughout the filling operation. As described, for a paste of a given viscosity the controllable filling parameters are vacuum level inside the chamber 128, pressure applied to the paste inside the nozzle 120, and scanning speed of nozzle 120 over the surface of wafer 122.

It is noted that with the exception of the rotary embodiments shown in FIGS. 9A, 9B and 9C, below the wafer fits snugly into a machined, countersunk notch in the tool base plate so that the wafer surface is very nearly planar with respect to the base plate surface. The nozzle moves across the surface filling the evacuated vias in its path and leaving only a very thin overburden on the wafer surface. Alternatively, positioning or banking pins may be used to hold the wafer in place.

Figure 9A:
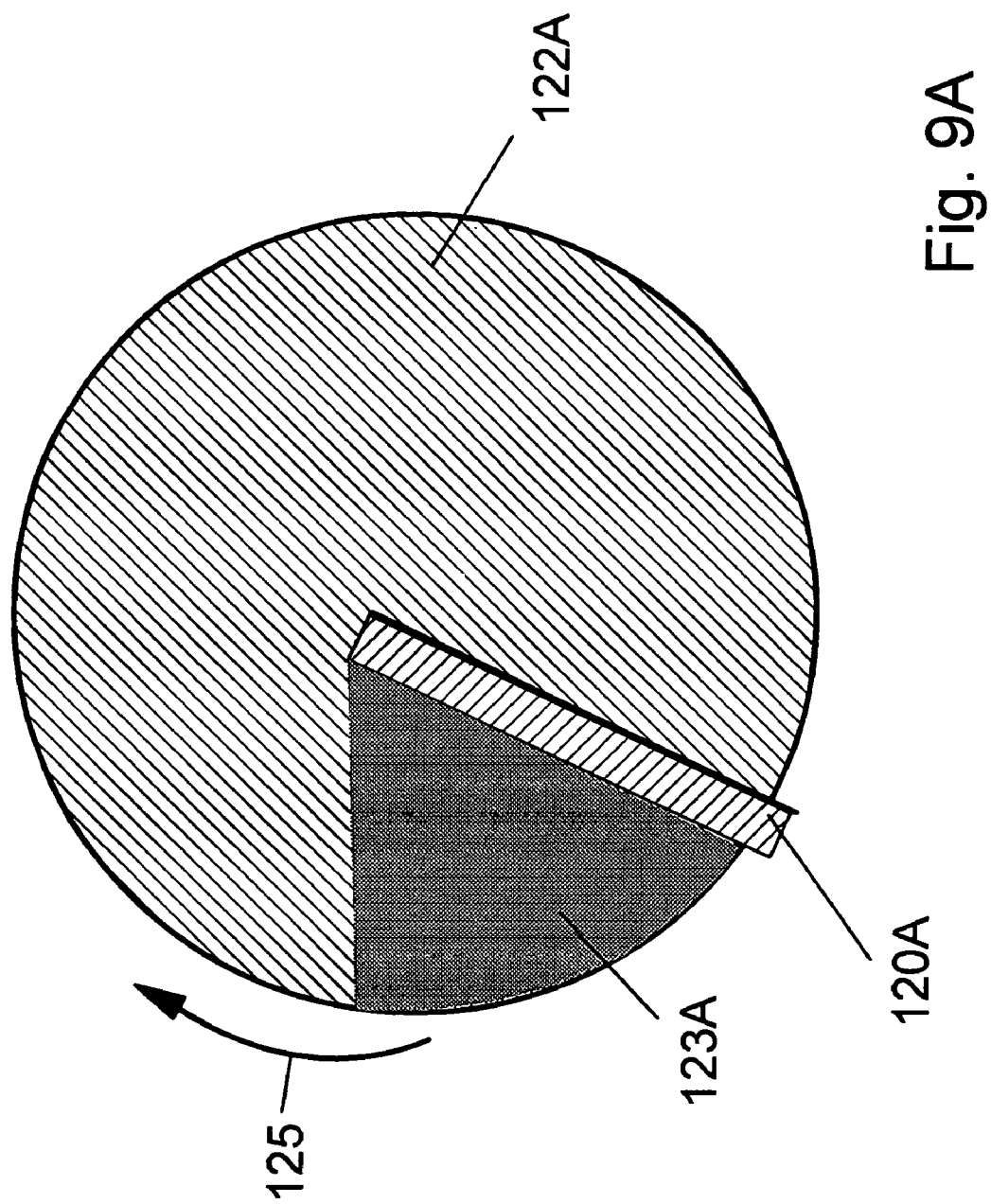
Figure 9B:
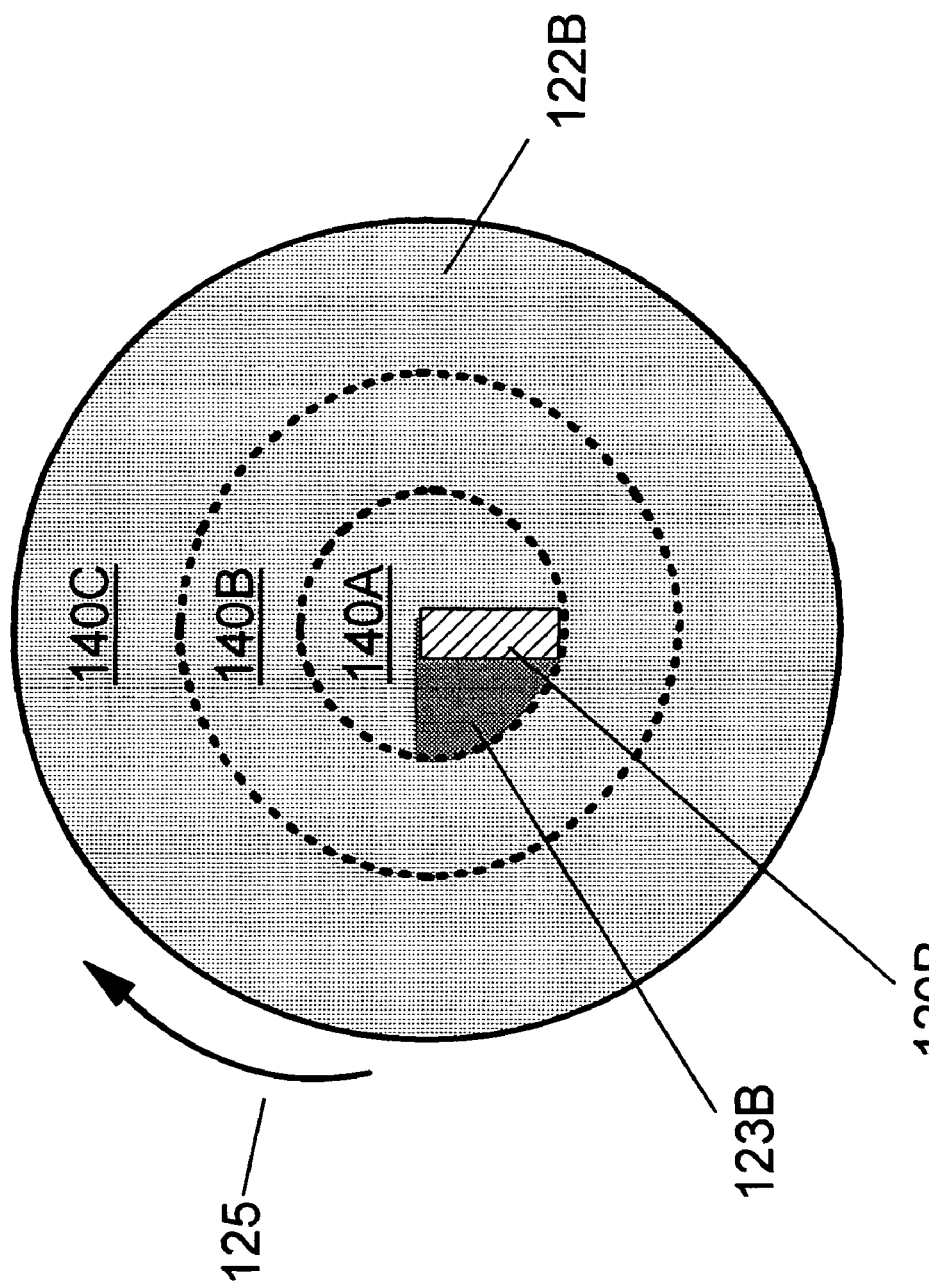

As shown in FIGS. 9A and 9B, the pressurized paste nozzle may also be advantageously applied in a rotary configuration wherein the wafer is held on a rotating base plate (not shown in FIGS. 9A to 9C) by, for example an electrostatic chuck (also not shown). The wafer 122A, 122B, 122C rotates as represented by arrow 125. The electrostatic chuck may be of conventional design with respect to the manner in which the wafer is held, but may differ in that provisions are made for applying the voltage used to secure the wafer with electrical connection means that permit rotation of the base plate.

A nozzle 120A is held stationary in a radial direction with respect to a rotating wafer 122A to apply paste 123A. This method has the advantage that the nozzle never touches another surface except that of the wafer to be filled. The nozzle may be designed to be less wide than the wafer radius to provide an edge exclusion zone where no paste is applied. Both of these features serve to make this embodiment of the invention particularly compatible with typical CMOS semiconductor processing.

The wafer is fixed on a rotating chuck (for example, an electrostatic chuck, as described above) and the paste nozzle is brought into contact with the wafer and moves across the surface filling the evacuated vias in its path and leaving a very thin overburden of the paste 123A on the surface of wafer 122A. As shown in FIG. 9A, a fixed nozzle can have a slot dimension nearly equal to the wafer radius as shown, or the full diameter.

FIG. 9B illustrates an embodiment that is particularly preferred, where the nozzle 120B, and thus the slot dimension, is less than the radius of the wafer 122B. In this embodiment the nozzle 120B must be moved, for example, in equal steps along the radial direction, such that separate paste delivery tracks 140A, 140B, 140C, etc. are defined. An exemplary mechanism for providing such movement is described below with respect to FIG. 9C. The combination of vacuum, paste pressure and dwell time of the nozzle over a via or collection of vias are important filling parameters. The embodiment shown in FIG. 9B allows wafer rotation speed to be adjusted for each separate paste delivery track to ensure that the average dwell time of the nozzle in any given location is approximately equal across the wafer. Another advantage of the smaller nozzle is that a higher overall paste pressure can be developed for a given amount of nozzle down force. The pressure of the paste multiplied by the area defined by the slot O-ring yields the force with which the nozzle must be held against the wafer surface to avoid any leakage under the O-ring seal. In general, any moving mechanical system such as that shown in FIG. 9B will have a maximum structural force at which it can properly operate. If the paste delivery area defined by the nozzle is reduced, the same mechanical down force will allow a higher nozzle pressure to be developed before the paste leakage condition is met.

Referring to FIG. 9C nozzle 120C is supported on an arm 142 connected to a block 144 with a threaded hole 145. A worm gear drive assembly comprises a threaded shaft 146, supported in fixed bearing blocks 148 and 150, extends through and engages the threads of hole 145. Shaft 146 is rotated by a motor 152 controlled by a speed controller 154. Motion of block 144 resulting from rotation of shaft 146 causes nozzle 120C to move radially with respect to wafer 122C. It will be recognized that in addition to depositing separate paste delivery tracks 140A, 140B, 140C, etc., as described above with respect to FIG. 9B., it is possible, once paste delivery track 140A has been deposited, to continuously move nozzle 120C radially outward with respect to wafer 122C until a desired surface region has been covered with paste. Suitable continuous adjustment in the rotational speed of the wafer is made to assure reasonably uniform paste delivery, as described.

It is noted that the worm gear drive mechanism described above with reference to FIG. 9C is merely exemplary, and that any other suitable drive mechanism may be used. Further, any such drive mechanisms may be used in any embodiment of the invention described in the various figures, wherein translational motion is required.

The three general embodiments outlined describe only the paste application step itself. A production tool based on any of these preferably also comprise the following functions: automated wafer handling from/to a cassette to the paste apply stage (loadlock); provision for cleaning the edge (if necessary) of the wafer (similar to edge bead removal in a resist coater); automated paste pressure control, metering and dispense; some form of automated inspection; and automated loading into a batch vacuum oven for low temperature drying in-situ.

The invention described herein has particular application to a semiconductor or glass substrate-based carrier for mounting and packaging multiple integrated circuit chips and/or other devices. The carrier is a freestanding chip or wafer with insulated, conductive through-vias exposed on its top and underside, to connect flip-chip and other device I/O through the carrier to next-level packaging, board, or other flip-chips mounted on the bottom side. However, it may be applied to any situation wherein a via, and in particular a deep via, must be filled with a viscous substance such as a paste.

Thus, it is noted that the foregoing has outlined some of the more pertinent objects and embodiments of the present invention. The concepts of this invention may be used for many applications. Thus, although the description is made for particular arrangements and methods, the intent and concept of the invention is suitable and applicable to other arrangements and applications. It will be clear to those skilled in the art that other modifications to the disclosed embodiments can be effected without departing from the spirit and scope of the invention. The described embodiments ought to be construed to be merely illustrative of some of the more prominent features and applications of the invention. Other beneficial results can be realized by applying the disclosed invention in a different manner or modifying the invention in ways known to those familiar with the art. Thus, it should be understood that the embodiments has been provided as an example and not as a limitation. The scope of the invention is defined by the appended claims.

The invention claimed is:

1. An apparatus for filing vias in a wafer, comprising:
    a chamber in which to place the wafer, said chamber being capable of being evacuated;
    a surface upon which to place said wafer;
    a pressurized paste delivery portion for providing a paste to fill said vias; and
    a pressurized paste filling portion for bringing said paste into contact with said vias under pressure so that said paste fills said vias, wherein said paste filling portion comprises:
    a planar surface onto which said paste is deposited; and
    a mechanism for applying pressure so that said paste on said surface is forced into contact with said wafer, wherein said mechanism for applying pressure comprises:
    a plate which defines said surface; and
    components for applying a pressure differential to said plate so as to force said plate toward said wafer.

2. The apparatus as recited in claim 1, wherein said paste filling portion provides said paste at a pressure within the range of 10 to 100 PSI.

3. The apparatus as recited in claim 1, wherein said paste delivery portion comprises:
    a surface onto which said paste is deposited; and
    a passageway through which said paste is delivered to said surface.

4. The apparatus as recited in claim 1, further comprising a compliant material on said surface to which said paste is applied.

5. The apparatus as recited in claim 1, wherein said surface upon which to place said wafer comprises a base plate having a recess for said wafer.

6. The apparatus as recited in claim 1, wherein said surface upon which to place said wafer comprises a surface of an electrostatic chuck.

7. The apparatus as recited in claim 1, wherein said paste delivery portion comprises a pressurized paste reservoir.

8. The apparatus as recited in claim 1, wherein said paste filling portion further comprises:
    an elongate member having a surface with a slot through which paste is provided to said wafer; and
    a compliant seal for sealing said surface to said wafer.

9. The apparatus as recited in claim 8, further comprising a mechanism for translating said member and said wafer with respect to one another so as to fill vias in successive portions of said wafer.

10. The apparatus as recited in claim 8, further comprising a mechanism for rotating said member and said wafer with respect to one another so as to fill vias in successive portions of said wafer.

11. The apparatus as recited in claim 10, wherein said mechanism for rotating said member and said wafer with respect to one another comprises a rotating base having said surface upon which said wafer is placed.

12. The apparatus as recited in claim 8, configured to accept a circular wafer, wherein said elongate member is disposed radially with respect to said wafer.

13. The apparatus as recited in claim 12, wherein said elongate member has a length less than that of a radius of said wafer, wherein said apparatus further comprises:
    a mechanism for rotating said wafer; and
    a mechanism for radially translating said member in a radial direction with respect to said wafer.

14. The apparatus as recited in claim 13, wherein said mechanism for rotating said wafer includes a rotation speed control to control speed of rotation of said wafer.

15. The apparatus as recited in claim 13, wherein said mechanism for radially translating said member includes a translation speed control to control speed of translation of said member with respect to said wafer.

16. The apparatus as recited in claim 13, wherein said mechanism for radially translating said member includes a worm gear assembly, and a motor for rotating a drive shaft of said assembly.

17. The apparatus as recited in claim 1, wherein said wafer is disposed entirely within said chamber.

18. The apparatus as recited in claim 1, wherein said paste filling portion is disposed entirely within said chamber.

19. The apparatus as recited in claim 1, wherein said wafer and said paste filling portion are disposed entirely within said chamber.

* * * * *